(12) United States Patent
Lin

(10) Patent No.: US 12,707,828 B2
(45) Date of Patent: Aug. 11, 2026

(54) DISPLAY PANELS, MANUFACTURING METHODS THEREOF, AND DISPLAY DEVICES

(71) Applicants: TCL CHINA STAR OPTOELECTRONICS TECHNOLOGY CO., LTD., Shenzhen (CN); JOLED Inc., Tokyo (JP)

(72) Inventor: Hai Lin, Tokyo (JP)

(73) Assignees: TCL CHINA STAR OPTOELECTRONICS TECHNOLOGY CO., LTD., Shenzhen (CN); JOLED Inc., Tokyo (JP)

( * ) Notice: Subject to any disclaimer, the term of this patent is extended or adjusted under 35 U.S.C. 154(b) by 403 days.

(21) Appl. No.: 18/357,200

(22) Filed: Jul. 24, 2023

(65) Prior Publication Data

US 2024/0040853 A1 Feb. 1, 2024

(30) Foreign Application Priority Data

Jul. 26, 2022 (JP) ................................ 2022-118412

(51) Int. Cl.
*H10K 59/123* (2023.01)
*H10K 59/12* (2023.01)
(Continued)

(52) U.S. Cl.
CPC ....... *H10K 59/123* (2023.02); *H10K 59/1201* (2023.02); *H10K 59/35* (2023.02); *H10K 59/80522* (2023.02)

(58) Field of Classification Search
CPC .. H10K 59/123; H10K 59/1201; H10K 59/35; H10K 59/80522; H10K 59/122;
(Continued)

(56) References Cited

U.S. PATENT DOCUMENTS 10,886,326 B2 * 1/2021 Bang ...................... H10K 59/40
11,917,847 B2 * 2/2024 Kwak ................. H10K 59/122
(Continued)

FOREIGN PATENT DOCUMENTS

EP 3460850 A1 3/2019
EP 3518288 A1 7/2019

OTHER PUBLICATIONS

European Office Action issued in corresponding European Patent Application No. 23187225.0 dated Dec. 14, 2023, pp. 1-9.

*Primary Examiner* — Kevin Quarterman
(74) *Attorney, Agent, or Firm* — PV IP PC; Christopher S. Ruprecht; Wei Te Chung

(57) ABSTRACT

Display panels, manufacturing methods thereof, and display devices are provided. The display panel includes a substrate, a thin film transistor layer, an insulation film, a first conductive layer disposed above the insulation film, a light-emitting layer including an organic material and disposed above the first conductive layer, a functional layer disposed above the light-emitting layer, and a second conductive layer disposed above the functional layer. The insulation film includes protrusions protruding upwards. The first conductive layer includes pixel electrodes and auxiliary electrodes insulated from the pixel electrodes. The auxiliary electrode is disposed above the protrusion and includes a protruding part having a height higher than that of the pixel electrode in a vertical direction. The functional layer includes through holes disposed above the protrusions. The second conductive layer is connected to the protruding parts via the through holes.

12 Claims, 21 Drawing Sheets

(51) Int. Cl.
*H10K 59/35* (2023.01)
*H10K 59/80* (2023.01)

(58) Field of Classification Search
CPC . H10K 59/124; H10K 59/1315; H10K 59/131
See application file for complete search history.

(56) References Cited

U.S. PATENT DOCUMENTS

| | | | | |
|---|---|---|---|---|
| 2013/0026475 | A1* | 1/2013 | Choi | H10K 59/1216 438/34 |
| 2018/0138441 | A1 | 5/2018 | Choung et al. | |
| 2019/0288046 | A1* | 9/2019 | Park | H10K 59/124 |
| 2021/0183990 | A1 | 6/2021 | Ikeda et al. | |
| 2022/0115483 | A1* | 4/2022 | Li | H10K 71/00 |

* cited by examiner

DISPLAY PANELS, MANUFACTURING METHODS THEREOF, AND DISPLAY DEVICES

CROSS-REFERENCE TO RELATED APPLICATION

This application claims priority to Japanese Patent Application No. 2022-118412, filed on Jul. 26, 2022, the disclosure of which is incorporated herein by reference in its entirety.

TECHNICAL FIELD

The present disclosure relates to the field of display technologies, and in particular, to display panels, manufacturing methods thereof, and display devices.

BACKGROUND

Existing organic electroluminescent display panels (referring to patent document 1 (JP 2007-103098) and patent document 2 (JP2020-9676), etc.) applied in display devices each has multiple pixels arranged in a matrix. Each pixel of the organic electroluminescent display panel includes an organic electroluminescent element, which is a self-luminous element. The organic electroluminescent display panel needs to apply voltages from a power supply arranged on outside of a display part to cathodes of the pixels arranged in the display part to achieve large-scale and high accuracy. In the organic electroluminescent display panel with large-scale and high accuracy, the pixel located far from the power supply may not normally display due to a large voltage drop of the cathode.

In order to reduce the voltage drop, in the inventions disclosed in patent documents 1 and 2, auxiliary electrodes are provided and connected to the power supply to reduce a resistance from the power supply to the pixel.

In the inventions disclosed in the patent documents 1 and 2, the auxiliary electrode is arranged in a same layer as a pixel electrode (an anode of the organic electroluminescent element) and between the pixels, and extends to the power supply. Therefore, in the inventions disclosed in the patent documents 1 and 2, an opening rate (a proportion of an area occupied by a self-luminous area in a display area of the display panel) is reduced compared to an absence of such auxiliary electrodes.

The auxiliary electrode is formed in a partial area within a dam that separates the pixels. A conductive layer arranged in a same layer as an electrode of a thin film transistor contained in a pixel circuit is connected to the power supply by the auxiliary electrode, so as to increase the opening rate of the display panel. However, when a through hole is defined, a portion of the organic material layer corresponding to a through hole needs to be removed by laser ablation. Therefore, it is necessary to increase a laser intensity of the laser in the laser ablation compared to a formation of a through hole in a part where the organic material layer is not formed, a damage to the auxiliary electrode located at a bottom of the through hole becomes greater, and residues such as the organic material layer may remain in the through hole, so that it is difficult to improve a process stability of the through hole.

SUMMARY

In view of above, display panels are provided according to embodiments of the present disclosure. The display panel includes a substrate, a thin film transistor layer disposed above the substrate, an insulation film disposed above the thin film transistor layer, a first conductive layer disposed above the insulation film, a light-emitting layer including an organic material and disposed above the first conductive layer, a functional layer disposed above the light-emitting layer, and a second conductive layer disposed above the functional layer; the insulation film includes protrusions protruding upwards; the first conductive layer includes pixel electrodes and auxiliary electrodes insulated from the pixel electrodes; the auxiliary electrode is disposed above the protrusion and includes a protruding part having a height higher than that of the pixel electrode in a vertical direction; the functional layer includes through holes disposed above the protrusions; and the second conductive layer is connected to the protruding parts via the through holes.

Display devices are also provided according to embodiments of the present disclosure. The display device includes the above-mentioned display panel.

Manufacturing methods of a display panel are also provided according to embodiments of the present disclosure. The manufacturing method includes: forming a substrate; forming a thin film transistor layer above the substrate; forming an insulation film above the thin film transistor layer; forming a first conductive layer including pixel electrodes and auxiliary electrodes insulated from the pixel electrodes above the insulation film; forming a light-emitting layer including an organic material above the first conductive layer; forming a functional layer above the light-emitting layer; defining through holes in the functional layer; and forming a second conductive layer connected to the auxiliary electrodes via the through holes above the functional layer. The insulation film includes protrusions protruding upwards; the auxiliary electrode is disposed above the protrusion and includes a protruding part having a height higher than that of the pixel electrode in a vertical direction; and the through holes are disposed above the protrusions.

REFERENCE NUMERALS

Figure 1:
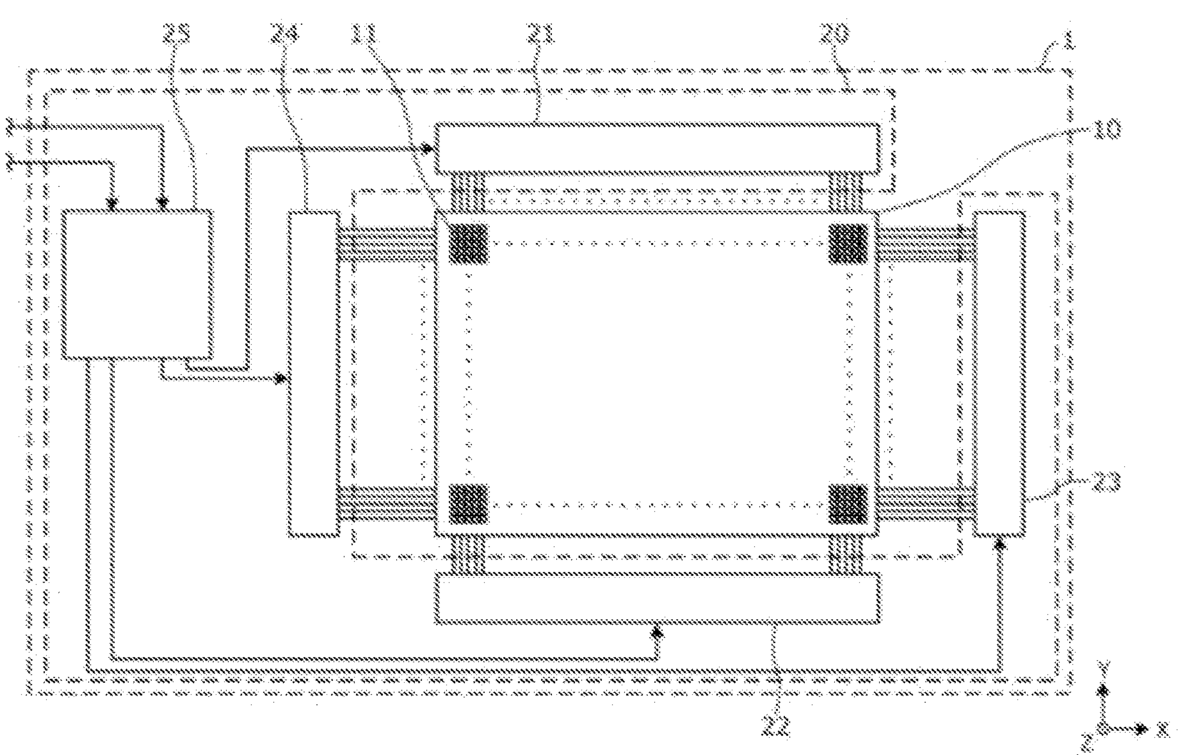
FIG. 1 is a schematic top view of a display device according to Embodiment 1 of the present disclosure.

1, display device; 10, display panel; 11, pixel; 11B, blue subpixel; 11G, green subpixel; 11R, red subpixel; 12S, auxiliary dam; 12X, row dam; 12Y, column dam; 17, package layer; 18, opposite substrate; 20, drive control circuit structure; 21, 22, 23, 24, drive circuit; 25, control circuit; 30, substrate; 40, thin film transistor layer; 41, lower conductive layer; 42, 44, 46, 47, 49, 50, insulation film; 43, semiconductor layer; 45, intermediate conductive layer; 48, upper conductive layer; 50P, protrusion; 51, first conductive layer; 51B, 51G, 51R, 51R1, pixel electrode; 51BH, 51GH, 51RH, 51SH, contact hole; 51S, auxiliary electrode; 51SP, protruding part; 52, second conductive layer; 52H, through hole; 61, hole transport layer; 62, light-emitting layer; 63, electron transport layer; 190, exposure mask; 190*a*, blocking part; 190*b*, semi-permeable part; 190*c*, permeable part; C, capacitor; D1, D2, drain; G1, G2, gate; EL, organic electroluminescent element; S1, S2, source; Tr1, Tr2, transistor; Va, power supply voltage line; Vcat, ground line; Vdat, data line; Vscn, scanning line.

DETAILED DESCRIPTION

Embodiments of the present disclosure are described with reference to the accompanying drawings. The embodiments described below are specific examples of the present disclosure. Therefore, values, shapes, materials, structural elements, configuration positions and connection methods of the structural elements, processes and process sequences, etc. illustrated in the following embodiments are exemplary and are not intended to limit the present disclosure. Accordingly, among the structural elements of the following embodiments, the structural elements not described in the independent claims represent the superlative concept of the present disclosure, and are interpreted as arbitrary structural elements.

The drawings are schematic and not strictly illustrative. Therefore, the proportions, etc. in the drawings are not consistent. In addition, in each drawing, duplicate descriptions are omitted or simplified for substantially identical structures marked with the same reference numerals.

In the present disclosure, the terms "above" and "below" do not refer to up (plumb up) and down (plumb down) in a sense of absolute space, but are used as terms defined based on relative position relationships of a stacking order in a laminated structure. Moreover, the terms "above" and "below" apply not only to a situation where two structural elements are configured at intervals and there may be other structural elements between the two structural elements, but also to a situation where the two structural elements are configured in contact with each other.

Embodiment 1

The display panel, the display device, and the manufacturing method of the display panel according to Embodiment 1 are descried as following.

[1-1. Structure of the Display Device]

A structure of the display device in the embodiment is illustrated as following with reference to FIG. 1, which is a schematic top view of the structure of the display device in the embodiment. X, Y, and Z axes are orthogonal to each other in FIG. 1 and the following figures. The X, Y, and Z axes define a right cartesian coordinate system. The X-axis direction, the Y-axis direction, and the Z-axis direction are configured as a row direction, a column direction, and a thickness direction respectively in the display panel 10.

The display device 1 illustrated in FIG. 1 includes a display panel 10. In the embodiment, the display device 1 further includes a drive control circuit structure 20 connected to the display panel 10. For example, the drive control circuit structure 20 includes four drive circuits 21 to 24 and a control circuit 25.

The display panel 10 is an organic electroluminescent display panel that utilizes an electroluminescence phenomenon of organic materials. The display panel 10 includes a plurality of pixels 11. The plurality of pixels 11 constitute a display part of the display panel 10. The plurality of pixels 11 are arranged, for example, in a matrix.

Each of the pixels 11 includes subpixels displaying different colors. In the embodiment, each of the pixels 11 includes a red subpixel 11R, a green subpixel 11G, and a blue subpixel 11B (referring to FIG. 3 below, etc.). It should be noted that, in the embodiment, although each of the pixels 11 includes three subpixels, a structure of the pixel 11 is not limited thereto. For example, each pixel 11 may also include four subpixels.

Herein, embodiments of a circuit structure of each subpixel is illustrated with reference to FIG. 2, which is a schematic view of the circuit structure of the display panel having the red subpixels 11R in the embodiment. It should be noted that the circuit structure of the red subpixel 11R is explained here as a representative of the subpixels, and the green subpixel 11G and the blue subpixel 11B may also have the same circuit structure.

Figure 2:
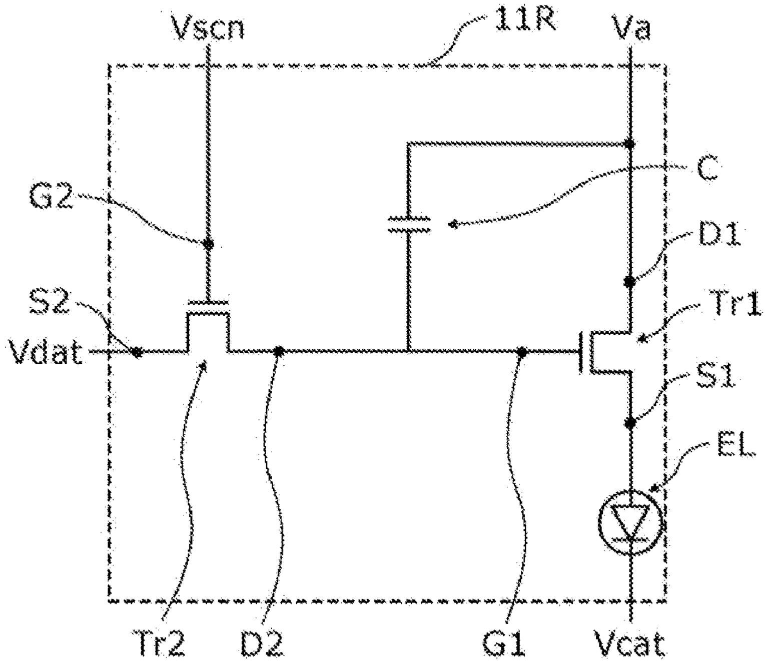
FIG. 2 is a schematic view of a circuit structure of a display panel having red subpixels in Embodiment 1 of the present disclosure.

As illustrated in FIG. 2, the red subpixel 11R includes two transistors Tr1 and Tr2, a capacitor C, and an organic electroluminescent element EL.

The transistor Tr1 and Tr2 are thin film transistors. The transistor Tr1 functions as a driving transistor, and transistor Tr2 functions as a switching transistor.

A drain D1 of the transistor Tr1 is connected to a power supply voltage line Va, and a source S1 of the transistor Tr1 is connected to a pixel electrode (an anode) of the organic electroluminescent element EL. A common electrode (a cathode) of the organic electroluminescent element EL is connected to a ground line Vcat.

A gate G2 of the transistor Tr2 is connected to a scanning line Vscn, a source S2 of the transistor Tr2 is connected to a data line Vdat, and a drain D2 of the transistor Tr2 is connected to a gate G1 of the transistor Tr1.

A first end of the capacitor C is connected with the drain D2 of the transistor Tr2 and the gate G1 of the transistor Tr1, and a second end of the capacitor C is connected to the power supply voltage line Va.

A gate line leaded from the gate G2 of the subpixel is connected to the scanning line Vscn, and the scanning line Vscn is connected, for example, to at least one of the drive circuit 23 and the drive circuit 24. A source line leaded from the source S2 of the subpixel is connected to the data line Vdat, and the data line Vdat is connected, for example, to at least one of the drive circuit 21 and the drive circuit 22.

The power supply voltage lines Va of the subpixels and the ground lines Vcat of the subpixels are gathered and then are respectively connected to a power supply voltage line and a ground liner of the display device 1.

Figure 4:
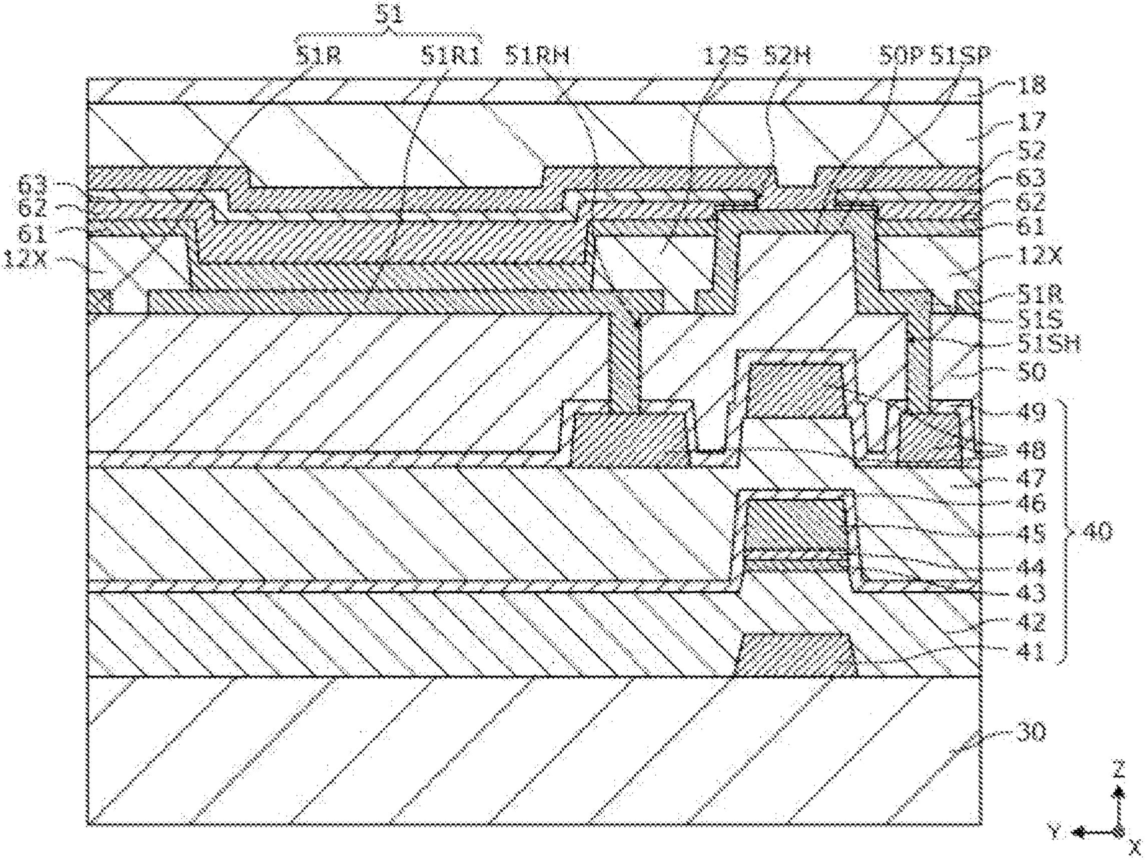
FIG. 4 is a first schematic cross-sectional view of the partial structure of the display panel in Embodiment 1 of the present disclosure.
Figure 5:
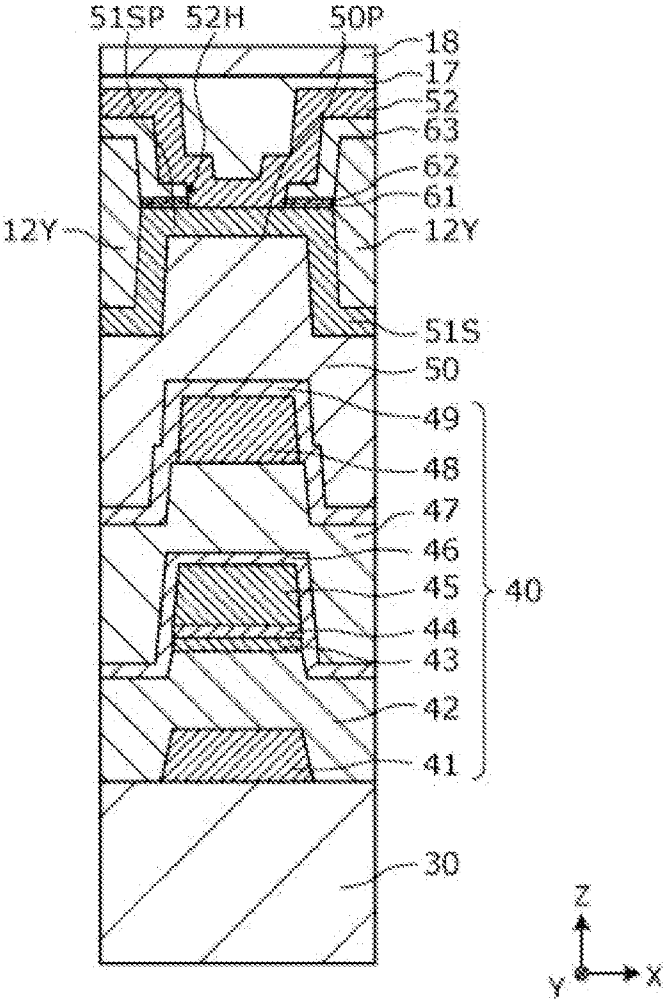
FIG. 5 is a second schematic cross-sectional view of the partial structure of the display panel in Embodiment 1 of the present disclosure.

A detailed structure of the display panel 10 in the embodiment is illustrated with reference to FIG. 3 to FIG. 5, which are respectively a schematic top view, a first schematic cross-sectional view, and a second schematic cross-sectional view of a partial structure of the display panel 10 in the embodiment. FIG. 4 and FIG. 5 respectively illustrate profiles along IV-IV and V-V lines in FIG. 3.

Figure 3:
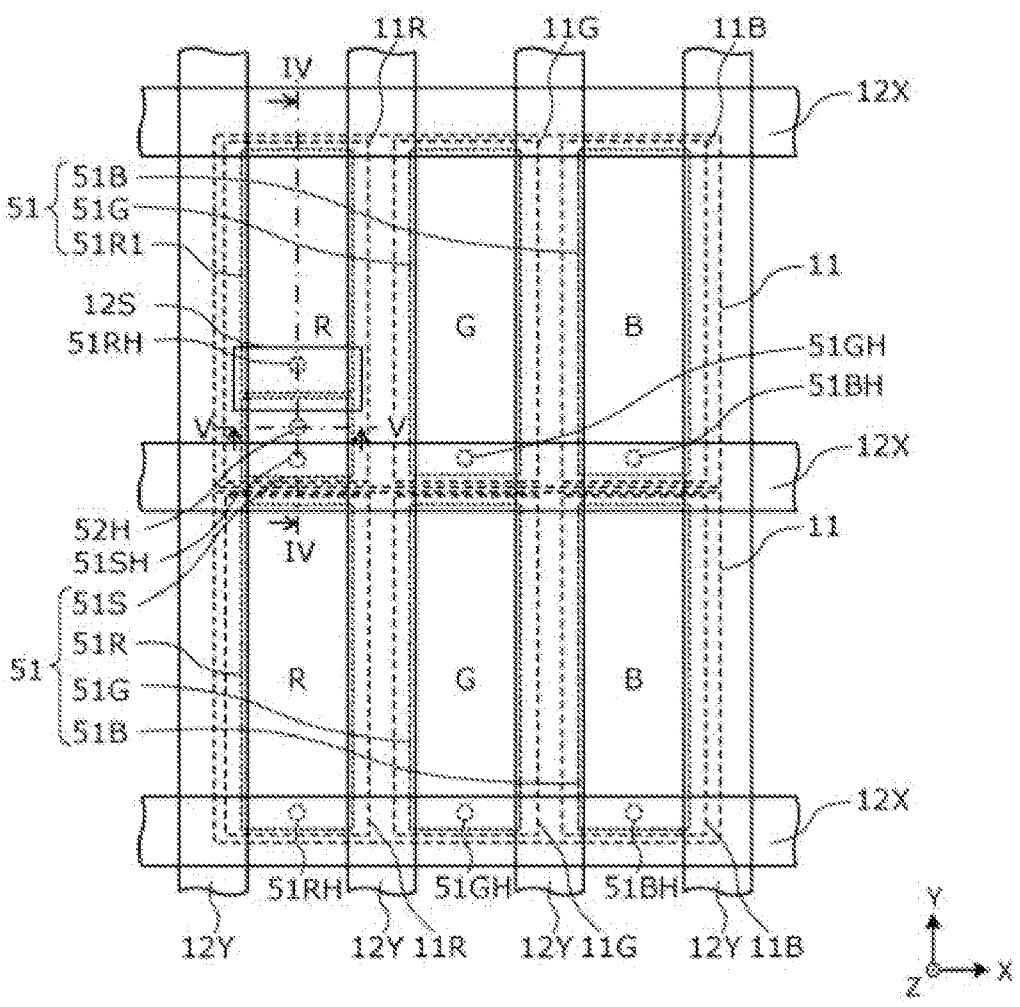
FIG. 3 is a schematic top view of a partial structure of a display panel in Embodiment 1 of the present disclosure.

As illustrated in FIG. 3, the display panel 10 includes a plurality of pixels 11 arranged in a matrix. Each of the plurality of pixels 11 includes a red subpixel 11R, a green subpixel 11G, and a blue subpixel 11B. The display panel 10 further includes column dams 12Y separating the red subpixel 11R, the green subpixel 11G, and the blue subpixel 11B, and includes row dams 12X each separating two adjacent red subpixels 11R, two adjacent green subpixels 11G, and two adjacent blue subpixel 11B.

The display panel 10 includes a first conductive layer 51. The first conductive layer 51 includes pixel electrodes 51R, 51R1, 51G, and 51B, and one or more auxiliary electrodes 51S electrically insulated from each of the pixel electrodes. A detailed structure of the first conductive layer 51 is described below.

Each of the pixel electrodes functions as an anode of the organic electroluminescent element EL, and is correspondingly connected to the source S1 (referring to FIG. 2) of the transistor Tr1 in the subpixel via a contact hole 51RH, 51GH, or 51BH defined in the insulation film 50 (referring to FIG. 4 and FIG. 5 below).

The auxiliary electrode 51S suppresses a voltage drop of the ground line Vcat. In the embodiment, the auxiliary electrode 51S is arranged in the red subpixel 11R. An area of the pixel electrode 51R1 of the red subpixel 11R where the auxiliary electrode 51S is located is less than an area of each of the pixel electrodes of other subpixels. Since the organic electroluminescent element EL having the red subpixel 11R has a longer life than the organic electroluminescent element EL having other subpixels, so it may suppress deterioration earlier than other subpixels. It should be noted that the auxiliary electrode 51S may also located in only at least one of the red subpixels 11R, but not need to be located in all of the red subpixels 11R. The auxiliary electrode 51S may also be connected to other conductive layers via the contact hole 51SH.

A laminated structure of the display panel 10 is illustrated with reference to FIG. 4 and FIG. 5. As illustrated in FIG. 4 and FIG. 5, the display panel 10 includes a substrate 30, a thin film transistor layer 40, an insulation film 50, a first conductive layer 51, a hole transport layer 61, a light-emitting layer 62, an electron transport layer 63, and a second conductive layer 52. In the embodiment, the display panel 10 further includes row dams 12X (referring to FIG. 4), column dams 12Y (referring to FIG. 5), a package layer 17, and an opposite substrate 18.

The substrate 30 is an insulating plate-like component that serves as a base of a circuit substrate of the display panel 10. In the embodiment, the substrate 30 is a glass substrate. It should be noted that the substrate 30 may have no special restrictions if it is an insulating substrate. For example, a flexible substrate may also be used as the substrate 30.

The thin film transistor layer 40 is a laminated body disposed above the substrate 30, and includes the transistors Tr1 and Tr2, the capacitors C, etc. contained in the pixels 11. It should be noted that in the cross-sectional views in such as FIG. 4 and FIG. 5, diagrams of laminated structures of the transistors Tr1, tr2, etc. contained in the thin film transistor layer 40 are omitted. The thin film transistor layer 40 includes a lower conductive layer 41, an intermediate conductive layer 45 disposed above the lower conductive layer 41, an upper conductive layer 48 disposed above the intermediate conductive layer 45, a semiconductor layer 43, and insulation films 42, 44, 46, 47, 49.

The lower conductive layer 41 is disposed above the substrate 30. The lower conductive layer 41 functions, for example, as a shielding electrode for the transistors Tr1, Tr2. Any conductive film may be used as the lower conductive layer 41. In the embodiment, the lower conductive layer 41 is a MoW film.

The insulation film 42 is disposed above the lower conductive layer 41. The insulation film 42 covers the lower conductive layer 41. A laminated film, for example, including a $SiN_x$ film and a $SiO_2$ film, may be used as the insulation film 42.

The semiconductor layer 43 is disposed above the insulation film 42. The semiconductor layer 43 is configured to form channel regions of the transistors Tr1, Tr2. In the embodiment, the semiconductor layer 43 includes an oxide semiconductor. The semiconductor layer 43 is composed of an oxide semiconductor including a main component containing, for example, at least one of In, Ga, Zn, Sn, Ti, and Nb. For example, ITZO (indium tin zinc oxide), IGZO (InGaZnO), ZnO, IZO (indium zinc oxide), IGO (indium gallium oxide), ITO (indium tin oxide), InO, etc. may be used as a material of the semiconductor layer 43.

The insulation film 44 is disposed above the semiconductor layer 43. For example, a $SiO_2$ film may be used as the insulation film 44. In the embodiment, the insulation film 44 is patterned in a same shape as the intermediate conductive layer 45.

The intermediate conductive layer 45 is a disposed above the lower conductive layer 41. In the embodiment, the intermediate conductive layer 45 is disposed above the insulation film 44. The intermediate conductive layer 45 is a conductive layer including the gates of the transistors Tr1 and Tr2. Any conductive film may be used as the intermediate conductive layer 45. In the embodiment, the intermediate conductive layer 45 is a laminated film composed of a Ti film, an Al film, and a Ti film.

The insulation film 46 is disposed above the intermediate conductive layer 45. For example, a $SiO_2$ film may be used as the insulation film 46. The insulation film 46 may be an inorganic insulation film such as a $SiN_x$ film, a SiON film, or an $Al_2O_3$ film, or an organic insulation film such as polyimide with photosensitivity or an acrylic resin, or a laminated film thereof.

The insulation film 47 is disposed above the insulation film 46. An inorganic insulation film such as a $SiN_x$ film, a SiON film, or an $Al_2O_3$ film, or an organic insulation film such as polyimide with photosensitivity or an acrylic resin may be used as the insulation film 47. It should be noted that the display panel 10 may also not have the insulation film 47.

The upper conductive layer 48 is disposed above the intermediate conductive layer 45. In the embodiment, the upper conductive layer 48 is disposed above insulation film 47. The upper conductive layer 48 is a conductive layer including the sources and the drains of the transistors Tr1 and Tr2. Any conductive film may be used as the upper conductive layer 48. A conductive film having the same structure as the intermediate conductive layer 45 may also be used as the upper conductive layer 48. In the embodiment, a laminated film composed of a Ti film, an Al film, and a Ti film is used as the upper conductive layer 48.

The insulation film 49 is disposed above the upper conductive layer 48. For example, a $SiO_2$ film may be used as the insulation film 49. Contact holes 51RH and 51SH are defined in the insulation film 49 to run through the insulation film 49. An inorganic insulation film such as a $SiN_x$ film, a SiON film, or an $Al_2O_3$ film, an organic insulation film such as polyimide with photosensitivity or an acrylic resin, or a laminated film thereof may be used as the insulation film 49.

The insulation film 50 is disposed above the thin film transistor layer 40. The insulation film 50 includes protrusions 50P protruding upwards. Below the protrusion 50P, the lower conductive layer 41, the intermediate conductive layer 45, and the upper conductive layer 48 are overlapped. In the embodiment, below the protrusion 50P, the insulation films 42, 44, 46, 47, and 49, and the semiconductor layer 43 are also overlapped. In the embodiment, the insulation film 50 includes an organic material. Contact holes 51RH and 51SH are defined in the insulation film 50 to run through the insulation film 50. The insulation film 50 may be made of a photosensitive organic material such as polyimide resin, phenolic resin, epoxy resin, acrylic resin, or other photosensitive organic materials.

The first conductive layer 51 is disposed above the insulation film 50. The first conductive layer 51 includes the pixel electrodes 51R, 51R1, 51G, and 51B, and the auxiliary electrodes 51S (referring to FIG. 3) electrically insulated from each of the pixel electrodes. Each pixel electrode functions as the anode of the organic electroluminescent element EL. The pixel electrodes 51R and 51R1 are connected to the upper conductive layer 48 via the contact hole 51RH. Similarly, the pixel electrodes 51G and 51B are connected to the upper conductive layer 48 via the contact holes 51GH and 51BH, respectively (referring to FIG. 3). The auxiliary electrode 51S is disposed above the protrusion 50P of the insulation film 50 and includes a protruding part 51SP located above the pixel electrode.

Any conductive film may be used as the first conductive layer 51. In the embodiment, an AlNd film is used as the first conductive layer 51. The first conductive layer 51 may also be a conductive film containing a monomer or an alloy of a metal element such as Al, Cr, Au, Pt, Ni, Cu, W, Ag, etc. Furthermore, the first conductive layer 51 may also include a laminated film, which includes the conductive film containing the monomer or alloy of these metal elements and a transparent conductive film capable of light transmission. Materials such as ITO (indium tin oxide), IZO (indium zinc oxide), zinc oxide (ZnO) may be cited to made the transparent conductive film. And zinc oxide with Al added (AZO) and zinc oxide with Ga added (GZO) may be cited as the zinc oxide material.

The first conductive layer 51 may also include a hole injection layer. The hole injection layer is a layer that injects holes supplied by each pixel electrode into the hole transport layer 61 and the light-emitting layer 62. The hole injection layer may be a layer of an oxide including, for example, Ag, Mo, V, W, Ni, etc.

The row dam 12X is an element separation layer separating two adjacent red subpixels 11R, two adjacent green subpixels 11G, and two adjacent blue subpixels 11B.

An auxiliary dam 12S is an element separation layer disposed between the pixel electrode 51R1 and the auxiliary electrode 51S. The auxiliary dam 12S extends in the X-axis direction.

The column dam 12Y is an element separation layer separating the red subpixel 11R, the green subpixel 11G, and the blue subpixel 11B. The column dam 12Y extends in the Y-axis direction.

In the embodiment, as illustrated in FIG. 4, an upper surface of the protruding part 51SP of the auxiliary electrode 51S is located above an upper surface of the row dams 12X. As illustrated in FIG. 5, the upper surface of the protruding part 51SP of the auxiliary electrode 51S is located below an upper surface of the column dams 12Y.

In the embodiment, the row dam 12X, the auxiliary dam 12S, and the column dam 12Y are made of organic materials such as resin, which have insulation. For example, acrylic resins, polyimide resins, phenolic resins, etc. may be used to made each dam. Each dam may also be resistant to organic solvents.

Each dam may also be made of an inorganic material. In this case, from the point of refractive index, for example, silicon oxide (SiO) may also be used to made each dam. Each dam may also be made of an inorganic material such as silicon nitride (SiN), silicon oxide (SiON), or other inorganic materials.

In the embodiment, a surface of the row dam 12X and a surface of the auxiliary dam 12S are less waterproof than a surface of the column dam 12Y. In order to reduce water resistance, the row dam 12X may also be subjected to ultraviolet radiation, low temperature baking treatment, etc. In order to improve the water resistance, the surface of the column dam 12Y may also be fluorine-treated. In addition, the column dam 12Y may also be made of a material containing fluorine. Thus, when the hole transport layer 61 and the light-emitting layer 62 are formed by printing, etc., it is possible to prevent a coating material from leaking past the column dam 12Y into adjacent subpixel.

The hole transport layer 61 is a layer containing an organic material disposed above the first conductive layer 51. In the embodiment, the hole transport layer 61 is a coating film formed by printing. As illustrated in FIG. 4, a thickness of a portion of the hole transport layer 61 above the protruding part 51SP of the auxiliary electrode 51S is less than a thickness of a portion of the hole transport layer 61 above the pixel electrodes 51R and 51R1. It should be noted that the thickness of the portion of the hole transport layer 61 above the protruding part 51SP of the auxiliary electrode 51S may also be zero. That is, the hole transport layer 61 may also be not disposed above the protruding part 51SP of the auxiliary electrode 51S. In the embodiment, in the hole transport layer 61, through holes 52H are defined above the protruding parts 51SP of the auxiliary electrodes 51S, respectively.

A material of the hole transport layer 61 may be a macromolecular compound such as polyfluorene or its derivatives, polyarylamine or its derivatives as amine-based organic polymers, or may be TFB (poly(9,9-di-n-octylfluorene-alt-(1,4-phenylene-((4-sec-butylphenyl)imino)-1,4-phenylene)).

The light-emitting layer 62 is a layer including an organic material disposed above the first conductive layer 51. In the embodiment, the light-emitting layer 62 is disposed above the hole transport layer 61. The light-emitting layer 62 functions as a light-emitting layer of the organic electroluminescent element EL. In the embodiment, the light-emitting layer 62 is a coating film formed by printing, etc. As illustrated in FIG. 4, a thickness of a portion of the light-emitting layer 62 above the protruding part 51SP of the auxiliary electrode 51S is less than a thickness of a portion of the light-emitting layer 62 above the pixel electrodes 51R and 51R1. It should be noted that the thickness of the portion of the light-emitting layer 62 above the protruding part 51SP of the auxiliary electrode 51S may also be zero. That is, the light-emitting layer 62 may also be not disposed above the protruding parts 51SP of the auxiliary electrodes 51S. In the embodiment, in the light-emitting layer 62, through holes 52H are defined above the protruding parts 51SP of the auxiliary electrodes 51S.

The light-emitting layer 62 outputs light by recombining the holes transported from the hole transport layer 61 and the electrons transported from the electron transport layer 63. A material of the light-emitting layer 62 may be a luminescent organic material which is, for example, capable of forming a film through wet printing. Specifically, the light-emitting layer 62 may be made of a fluorescent material, such as oxygenoids, perylene compounds, coumarin compounds, azacoumann compounds, oxazole compounds, oxadiazole compounds, purpurone compounds, pyrrolazolar compounds, naphthalene compounds, anthracene compounds, fluorene compounds, fluorene compounds, tetraphenyl compounds, pyrene compounds, rosin compounds, quinolone compounds and azaquinolone compounds, pyrazoline derivatives and pyrazolone derivatives, rhodamine compounds, chromene compounds, phenanthrene compounds, cyclopentadiene compounds, Stilbene compounds, diphenylquinone compounds, styrene compounds, butadiene compounds, dicyanzymethylenepyran compounds, dicyanomethylenethian compounds, fluorescein compounds, pyranium compounds, thiadian compounds, selenium pyranium compounds, terpene pyranium compounds, aromatic aldehyde diene compounds, oligophenylene compounds, thioxene compounds, anthracene compounds, anthocyanine compounds, acridine compounds, metal complexes of 8-hydroxyquinoline compounds, metal complexes of 2-bipyridine compounds, schiff salt complexes with group III metals, oxidation ketone metal complexes, or rare earth complexes.

The electron transport layer 63 is an example of a functional layer disposed above the light-emitting layer 62. In the embodiment, the electron transport layer 63 is a layer that transmits electrons supplied from the second conductive layer 52 to the light-emitting layer 62. The electron transport layer 63 is disposed above the pixel electrodes and the auxiliary electrodes 51S. In the electron transport layer 63, through holes 52H are defined above the protruding parts 51SP of the auxiliary electrodes 51S. In the embodiment, the through hole 52H continuously penetrates the electron transport layer 63, the light-emitting layer 62, and the hole transport layer 61. A material of the electron transport layer 63 may be a π-electronic low molecular organic material, such as oxadiazole derivatives (OXD), triazole derivatives (TAZ), phenanthroline derivatives (BCP, Bphen), and the like. The electron transport layer 63 may also include a layer formed by sodium fluoride.

The second conductive layer 52 is disposed above the electron transport layer 63. The second conductive layer 52 is connected to the protruding parts 51SP of the auxiliary electrodes 51S via the through holes 52H defined in the electron transport layer 63 (and the light-emitting layer 62 and the hole transport layer 61). In the embodiment, the second conductive layer 52 is disposed on an entire upper surface of the electron transport layer 63, and is a common electrode that functions as cathodes of the plurality of organic electroluminescent elements EL. By connecting the second conductive layer 52 with the auxiliary electrodes 51S, an entire resistance of conductive layers including the second conductive layer 52 which functions as the cathodes of the organic electroluminescent elements EL, the auxiliary electrodes 51S, and the upper conductive layer 48 connected to the auxiliary electrodes 51S may be reduced. Therefore, it is possible to reduce an entire voltage drop of the conductive layer which functions as the cathodes of the organic electroluminescent elements EL, thereby achieving a normal display even when the display panel 10 is large-sized.

For example, a transparent conductive film may be used as a second conductive layer 52. For example, ITO, IZO, zinc oxide materials, etc. may be cited as a material of the transparent conductive film. For example, zinc oxide with Al added, zinc oxide with Ga, etc. may be cited as the zinc oxide material. And, for example, Ag, Ag alloy, etc. may be used to made the second conductive layer 52.

The package layer 17 is an insulation layer located above the second conductive layer 52. The package layer 17 has a function of encapsulating the organic electroluminescent elements EL. A material of the package layer 17 may be a translucent material such as silicon nitride (SiN) or silicon oxide nitride (SiON). The package layer 17 may also include a layer made of silicon nitride (SiN) and silicon oxide nitride (SiON) and an encapsulation resin layer which is disposed on the aforementioned layer and consists of a resin material such as acrylic resin and silicone.

The opposite substrate 18 is a light-transmitting component paired with the substrate 30 and disposed above the package layer 17. The opposite substrate 18 and the package layer 17 and the like have the function of encapsulating the organic electroluminescent elements EL. The opposite substrate 18 is made of a material, for example, glass, plastic, etc., which is configured to transmit the light emitted by the organic electroluminescent elements EL. Furthermore, the opposite substrate 18 may also include an optical filter. The opposite substrate 18 may also include an optical filter, such as a color filter, a circularly polarizing filter, an anti-reflection filter, or the like.

[1-2. Manufacturing Method of the Display Panel]

Figure 6:
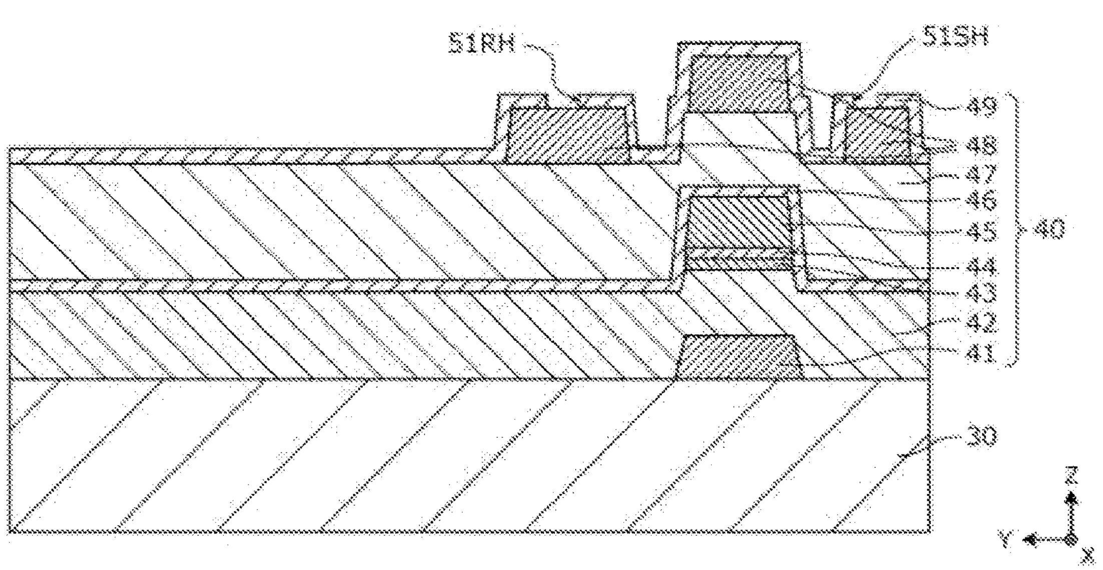
FIG. 6 is a schematic cross-sectional view of a first process of a manufacturing method of the display panel in Embodiment 1.

The manufacturing method of the display panel 10 is illustrated with reference to FIG. 4 to FIG. 21. FIG. 6 to FIG.

21 are schematic cross-sectional views of the processes of the manufacturing method of the display panel 10 in the embodiment.

Figure 10:
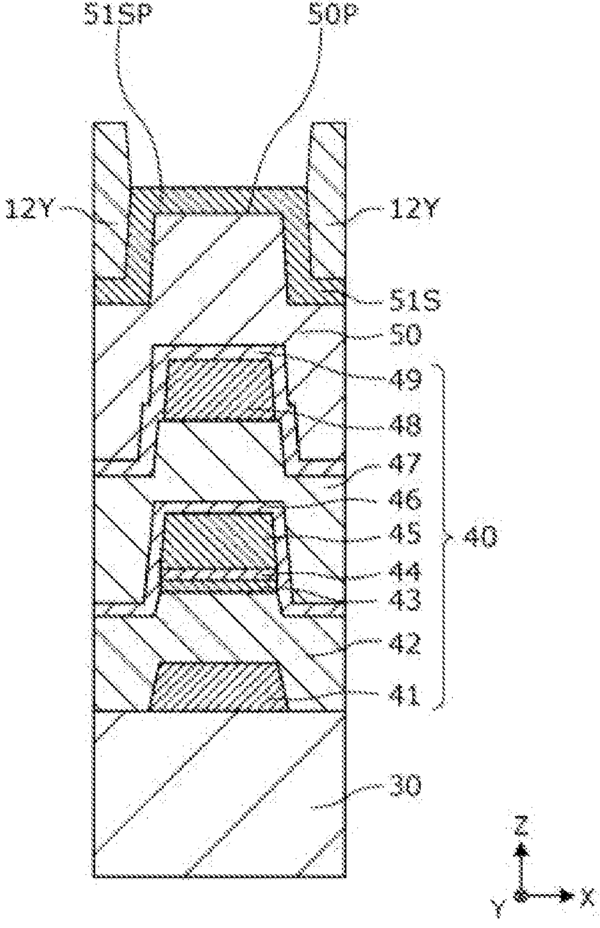
FIG. 10 is a schematic cross-sectional view of a fifth process of the manufacturing method of the display panel in Embodiment 1.
Figure 11:
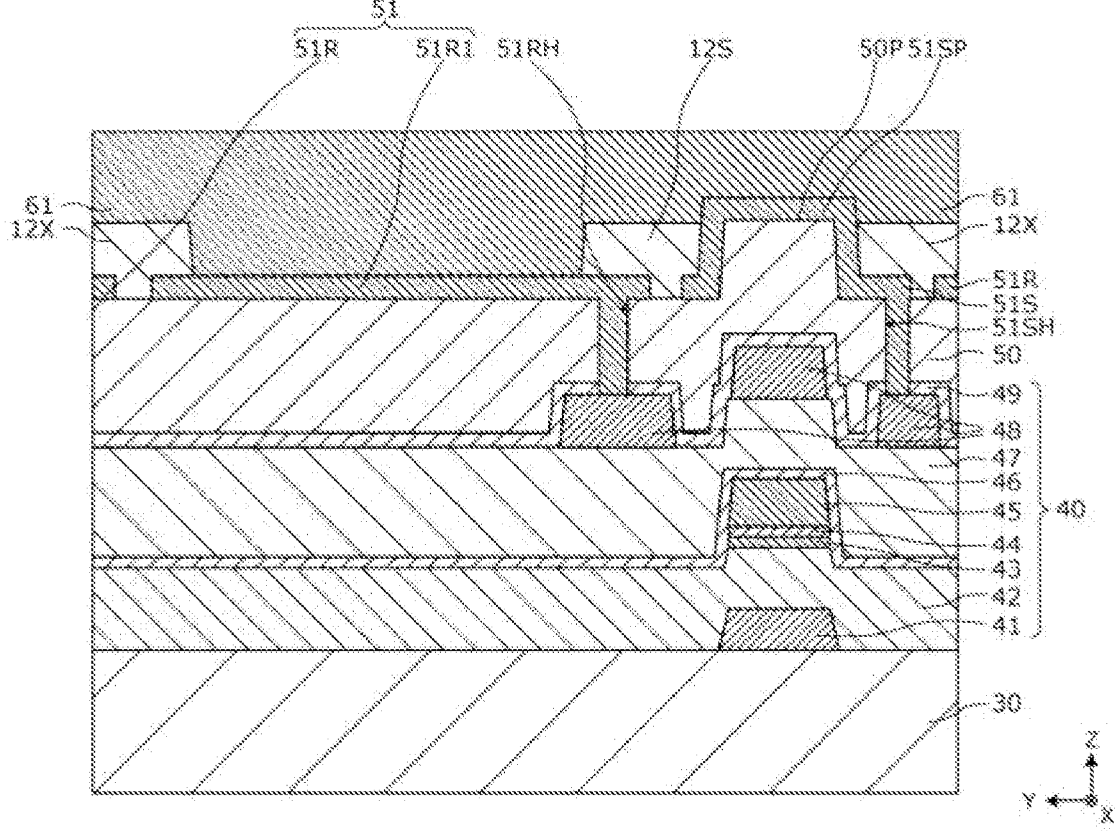
FIG. 11 is a first schematic cross-sectional view of a sixth process of the manufacturing method of the display panel in Embodiment 1.
Figure 12:
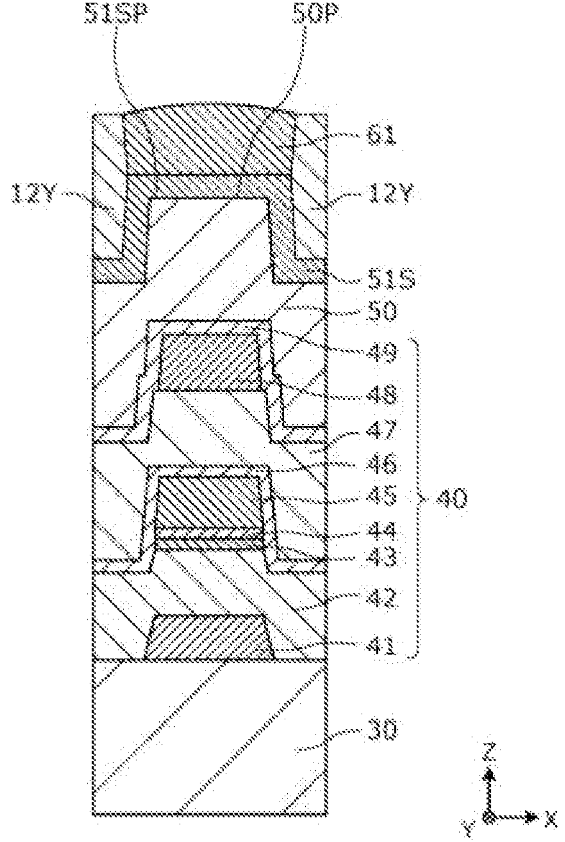
FIG. 12 is a second schematic cross-sectional view of the sixth process of the manufacturing method of the display panel in Embodiment 1.
Figure 13:
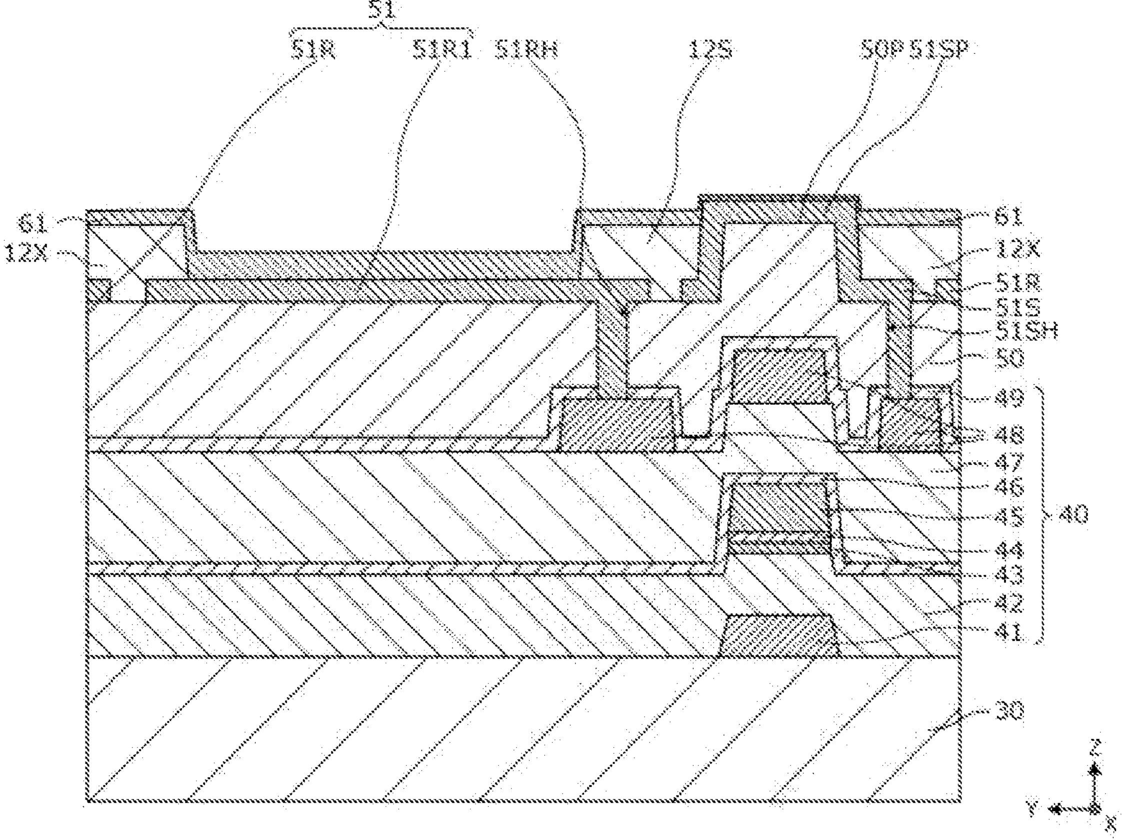
FIG. 13 is a first schematic cross-sectional view of a seventh process of the manufacturing method of the display panel in Embodiment 1.
Figure 14:
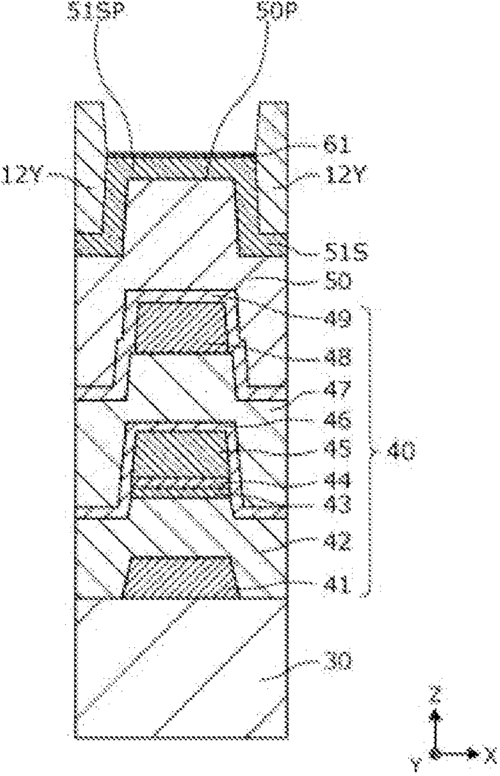
FIG. 14 is a second schematic cross-sectional view of the seventh process of the manufacturing method of the display panel in Embodiment 1.

FIG. 6 to FIG. 9, FIG. 11, FIG. 13, and FIG. 19 to FIG. 21 are cross-section views of the display panel 10 at a same position as illustrated in FIG. 4. FIG. 10, FIG. 12, and FIG. 14 are cross-section views of the display panel 10 at a same position as illustrated in FIG. 5.

First, as illustrated in FIG. 6, an insulating substrate 30 is formed, and a thin film transistor layer 40 is formed above the substrate 30.

A formation of the thin film transistor layer 40 includes: forming a lower conductive layer 41, forming an intermediate conductive layer 45 above the lower conductive layer 41, and forming an upper conductive layer 48 above the intermediate conductive layer 45. In the embodiment, the formation of the thin film transistor layer 40 further includes: forming an insulation film 42, forming a semiconductor layer 43, forming an insulation film 44, forming an insulation film 46, forming an insulation film 47, and forming an insulation film 49. Furthermore, the lower conductive layer 41, the intermediate conductive layer 45, and the upper conductive layer 48 are laminated below the protrusions 50P of the insulation film 50 formed later.

In the formation of the thin film transistor layer 40, the lower conductive layer 41 is first formed above the substrate 30. In the embodiment, a MoW film with a thickness of 50 nm is formed on the substrate 30 through a sputtering method, and is patterned through photolithography and dry etching using CF-gas or SF-gas.

Next, an insulation film 42 is formed above the lower conductive layer 41. In the embodiment, a $SiN_x$ film with a thickness of 100 nm and a $SiO_2$ film with a thickness of 200 nm are formed sequentially above the substrate 30 and the lower conductive layer 41 through chemical vapor deposition.

Next, the semiconductor layer 43 is formed above the insulation film 42. In the embodiment, an oxide semiconductor film containing In, Ga, and Zn with a thickness of 30 nm is formed by sputtering, and then patterned into a specific shape by photolithography. At this time, annealing may also be performed in an environment that appropriately contains oxygen, etc. for purposes such as adjusting a carrier concentration of the oxide semiconductor film.

Next, the insulation film 44 is formed above the semiconductor layer 43. In the embodiment, a $SiO_2$ film with a thickness of 150 nm is formed above the insulation film 42 and the semiconductor layer 43 by chemical vapor deposition.

Next, the intermediate conductive layer 45 is formed above the insulation film 44. In the embodiment, a Ti film with a thickness of an Al film with a thickness of 300 nm, and a Ti film with a thickness of 50 nm are successively formed on the insulation film 44 as a conductive film by sputtering. Next, the intermediate conductive layer 45 is patterned into a specific shape by photolithography and dry etching using Cl-gas.

Next, the insulation film 44 is patterned. In the embodiment, the intermediate conductive layer 45 serves as a mask, and the insulation film 44 is patterned by dry etching. During a process of the dry etching, e.g. CF-gas may be used. Thus, the insulation film 44 is patterned in a same shape as the intermediate conductive layer 45.

Next, the insulation film 46 is formed above the intermediate conductive layer 45. In the embodiment, a $SiO_2$ film with a thickness of 500 nm is formed above the intermediate conductive layer 45, the semiconductor layer 43, and the insulation film 42 by chemical vapor deposition.

Next, the insulation film 46 is patterned. In the embodiment, the insulation film 46 is patterned by photolithography and dry etching using CF-gas.

Next, the insulation film 47 is formed above the insulation film 46. In the embodiment, a photosensitive organic material such as polyimide resin, phenolic resin, epoxy resin, or acrylic resin is coated as the insulation film 47. It should be noted that an inorganic insulation film such as a $SiN_x$ film, a SiON film, or an $Al_2O_3$ film may be formed as the insulation film 47. The formation of the insulation film 47 may also be omitted.

Next, the upper conductive layer 48 is formed above the insulation film 47. In the embodiment, a Ti film with a thickness of 50 nm, an Al film with a thickness of 300 nm, and a Ti film with a thickness of are successively formed above the insulation film 47 as a conductive film by sputtering. Next, the upper conductive layer 48 is patterned into a specific shape by photolithography and dry etching using Cl-gas.

Next, the insulation film 49 is formed above the upper conductive layer 48. In the embodiment, a $SiO_2$ film with a thickness of 500 nm is formed above the upper conductive layer 48 and the insulation film 47 by chemical vapor deposition.

Next, the insulation film 49 is patterned. In the embodiment, by photolithography and dry etching using CF-gas, contact holes 51RH, 51SH, 51GH, 51BH (referring to the contact holes 51GH, 51BH in FIG. 3) are defined in the insulation film 49.

The thin film transistor layer 40 is formed as described above.

Figure 7:
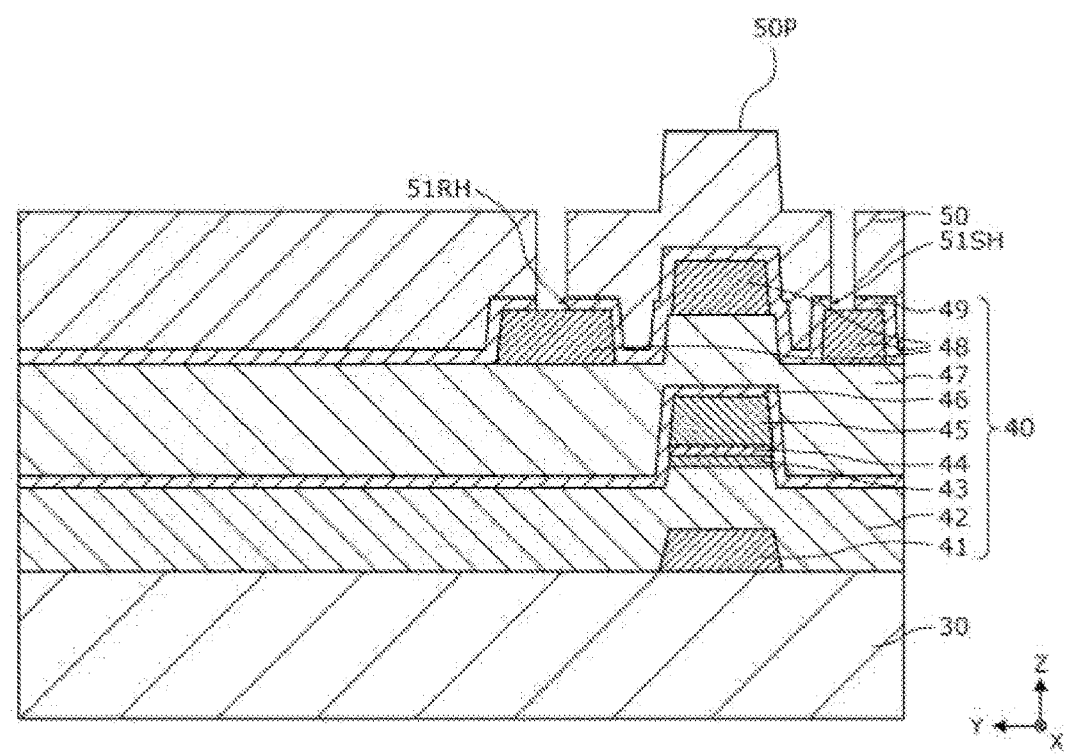
FIG. 7 is a schematic cross-sectional view of a second process of the manufacturing method of the display panel in Embodiment 1.

Then, as illustrated in FIG. 7, an insulation film 50 is formed above the thin film transistor layer 40. In the embodiment, the insulation film 49 is coated with a positive photosensitive organic material such as polyimide resin, phenolic resin, epoxy resin, acrylic resin, or the like. Next, the insulation film 50 is patterned. Specifically, the insulation film 50 is patterned by exposure, development, and firing. Thus, contact holes 51RH and 51SH are defined. The insulation film 50 thus formed includes protrusions 50P protruding upwards above an area where the lower conductive layer 41, the intermediate conductive layer 45, and the upper conductive layer 48 are laminated.

Figure 8:
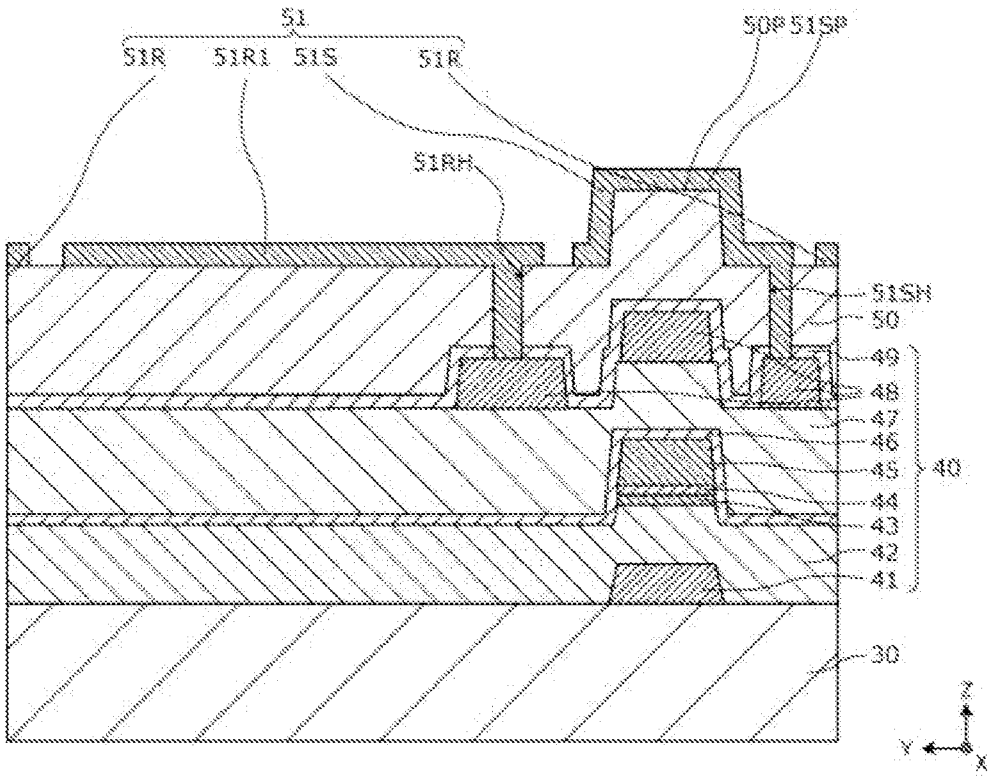
FIG. 8 is a schematic cross-sectional view of a third process of the manufacturing method of the display panel in Embodiment 1.

Then, as illustrated in FIG. 8, a first conductive layer 51 is formed above the insulation film 50. The first conductive layer 51 includes pixel electrodes and one or more auxiliary electrodes 51S electrically insulated from each pixel electrode. It should be noted that FIG. 8 only illustrates the first conductive layer 51 having the pixel electrodes 51R and 51R1 and the auxiliary electrode 51S, but in this process, the pixel electrodes 51G and 51B as illustrated in FIG. 3 are also formed. In the embodiment, an AlNd film with a thickness of 200 nm is formed above the insulation film 50 and inside the contact holes 51RH, 51SH, 51GH, and 51BH (referring to the contact holes 51GH, 51BH of FIG. 3) as a conductive film through a sputtering method. Next, by photolithography and etching using a phosphoric acid-acetic acid-nitric acid etching agent, the first conductive layer 51 is patterned into a specific shape, thereby forming the pixel electrodes and the auxiliary electrodes 51S. The auxiliary electrode 51S thus formed is disposed above the protrusion 50P of the insulation film 50 and includes a protruding part 51SP located above the pixel electrode.

Figure 9:
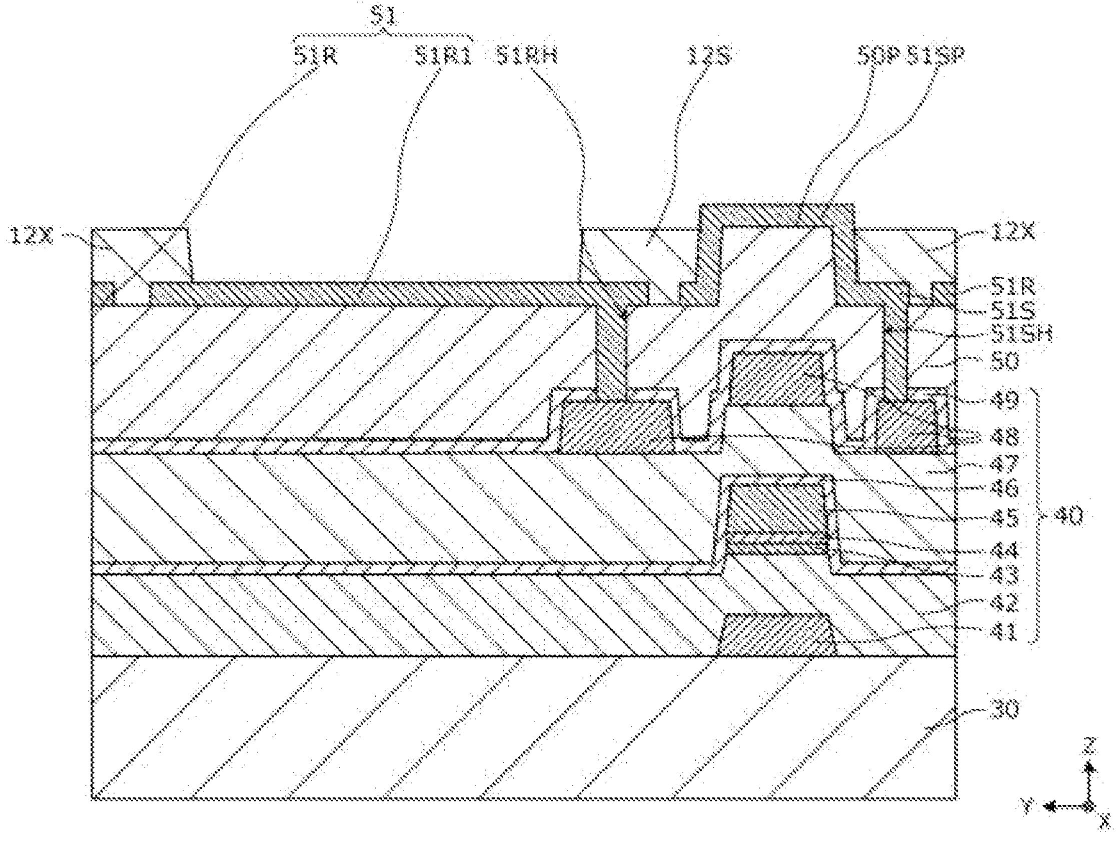
FIG. 9 is a schematic cross-sectional view of a fourth process of the manufacturing method of the display panel in Embodiment 1.

Then, as illustrated in FIG. 9, row dams 12 and an auxiliary dam 12S are formed above the first conductive layer 51. In the embodiment, a resin film composed of materials (e.g., photosensitive resin materials) of the row dam 12X and the auxiliary dam 12S is formed above the first conductive layer 51 through a spin coating method. Then, the row dams 12X and the auxiliary dam 12S are formed by patterning the resin film. The row dams 12X and the auxiliary dam 12S are patterned through photomask exposure above the resin film, the development process, and the firing process (about 230° C. and about 60 minutes).

Then, as illustrated in FIG. 10, column dams 12Y are formed above the first conductive layer 51. During a formation process of the column dams 12Y, a resin film composed of a material (e.g., photosensitive resin material) of the column dam 12Y is formed on the first conductive layer 51, the row dams 12X, and the auxiliary dam 12S through a spin coating method. The resin film is then patterned to form the column dams 12Y. The column dams 12Y are patterned through photomask exposure above the resin film, the development process, and the firing process (about 230° C. and about 60 minutes). It should be noted that a conductive film made of a material such as Ag, Mo, V, W, Ni, or the like may also be formed in advance on an upper surface of the first conductive layer 51, and the conductive layer on the upper surface of the first conductive layer 51 is oxidized during the firing processes of the row dams 12X, the auxiliary dam 12S, and the column dams 12Y, thereby forming the hole injection layer.

Next, a hole transport layer 61 including an organic material is formed above the first conductive layer 51. A formation of hole transport layer 61 is illustrated with reference to FIG. 11 to FIG. 14. First, as illustrated in FIG. 11 and FIG. 12, a material of the hole transport layer 61 is configured on the first conductive layer 51. In the embodiment, the hole transport layer 61 is formed by coating. More specifically, the hole transport layer 61 is formed by an inkjet method, a gravure printing method, or other printing. Thus, as illustrated in FIG. 12, the material of the hole transport layer 61 is coated between every two adjacent column dams 12Y. A height of an upper surface of the material of the hole transport layer 61, as illustrated in FIG. 11, may be approximately same in the Y direction; and as illustrated in FIG. 12, a central part of the material may become convex in the X direction. At this time, due to the low waterproofing of the row dam 12X and the auxiliary dam 12S, the hole transport layer 61 may be higher than the row dams 12X and the auxiliary dam 12S. In addition, since the column dam 12Y has waterproof, as illustrated in FIG. 12, even if the upper surface of the material of the hole transport layer 61 is above an upper surface of the column dams 12Y, the material of the hole transport layer 61 may be inhibited from being higher than the column dams 12Y.

Next, the material of the hole transport layer 61 is dried. Thus, as illustrated in FIG. 13 and FIG. 14, a volume of the hole transport layer 61 is reduced, and the upper surface of the hole transport layer 61 is lowered. At this time, the upper surface of the protruding part 51SP of the auxiliary electrode 51S is located above the upper surface of the row dam 12X, above the upper surface of the auxiliary dam 12S, and above the upper surface of the pixel electrode. Thus, the thickness of the portion of the hole transport layer 61 above the protruding part 51SP of the auxiliary electrode 51S is less than the thickness of the portion of the hole transport layer 61 above the pixel electrode. It should be noted that the hole transport layer 61 may also be formed by repeating the above process of layers forming the portions of the hole transport layer 61.

Figure 15:
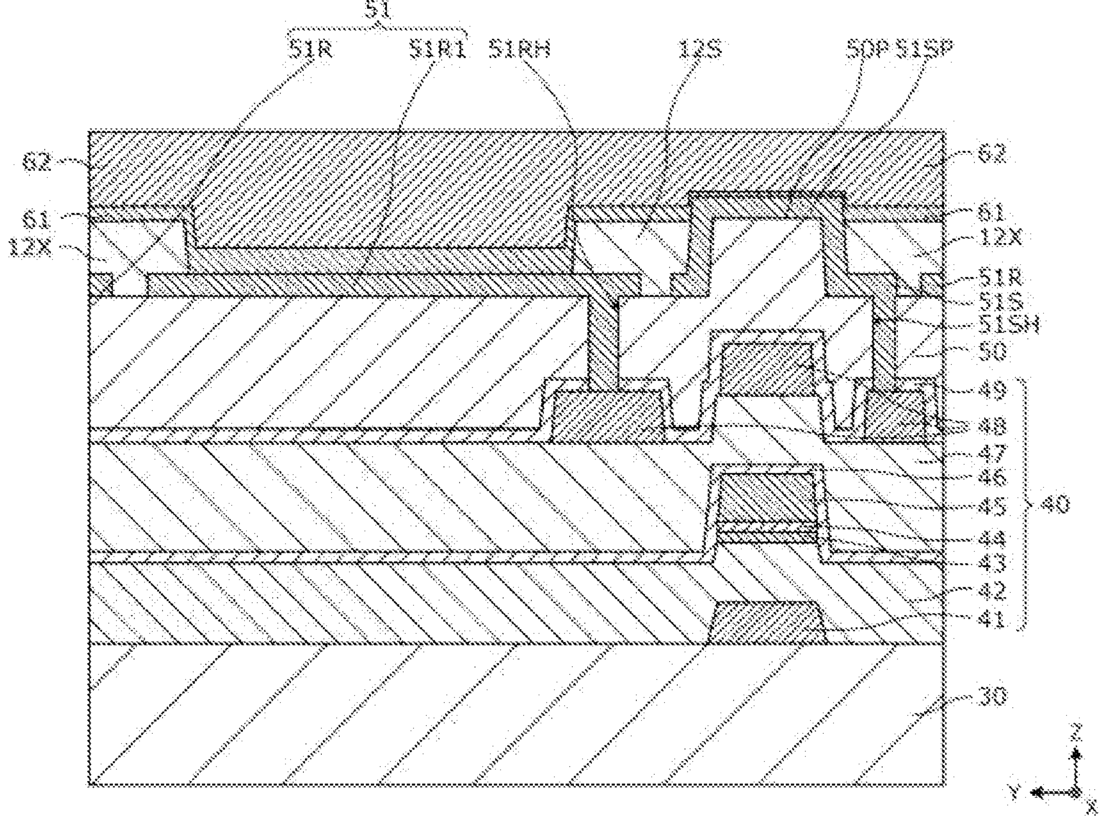
FIG. 15 is a first schematic cross-sectional view of an eighth process of the manufacturing method of the display panel in Embodiment 1.
Figure 16:
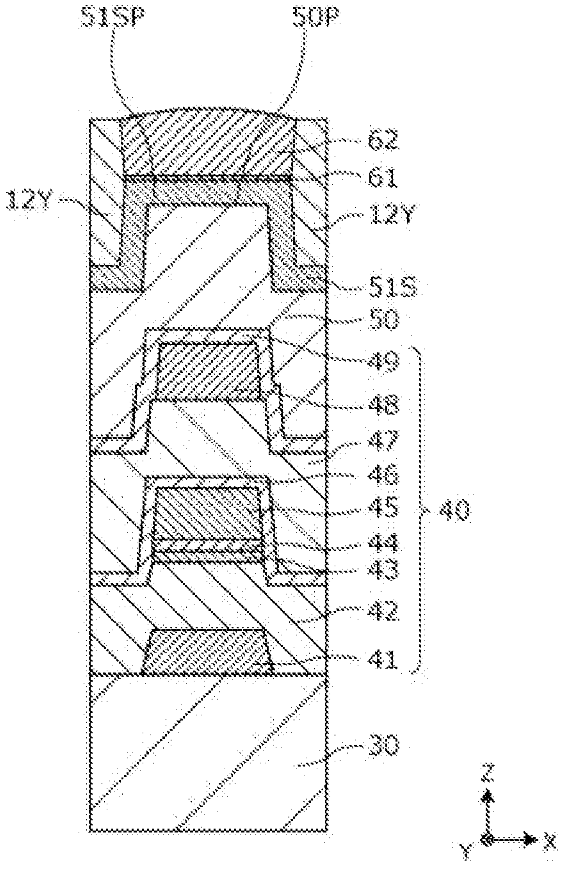
FIG. 16 is a second schematic cross-sectional view of the eighth process of the manufacturing method of the display panel in Embodiment 1.

Next, a light-emitting layer 62 including an organic material is formed above the first conductive layer 51. In the embodiment, the light-emitting layer 62 is formed above the hole transport layer 61. A formation of the light-emitting layer 62 is illustrated with reference with FIG. 15 to FIG. 18. First, as illustrated in FIG. 15 and FIG. 16, a material of the light-emitting layer 62 is configured above the hole transport layer 61. In the embodiment, the light-emitting layer 62 and the hole transport layer 61 are likewise, formed by coating. More specifically, the light-emitting layer 62 is formed by an inkjet method, a gravure printing method, or other printing. Thus, as illustrated in FIG. 16, the material of the light-emitting layer 62 is coated between every two adjacent column dams 12Y. A height of an upper surface of the material of the light-emitting layer 62, as illustrated in FIG. may be approximately same in the Y direction; and as illustrated in FIG. 16, a central part of the material may become convex in the X direction. At this time, due to the low waterproofing of the row dam 12X and the auxiliary dam 12S, the light-emitting layer 62 may be higher than the row dams 12X and the auxiliary dam 12S. In addition, since the column dam 12Y has waterproof, as illustrated in FIG. 16, even if the upper surface of the material of the light-emitting layer 62 is above an upper surface of the column dams 12Y, the material of the light-emitting layer 62 may be inhibited from being higher than the column dams 12Y.

Figure 17:
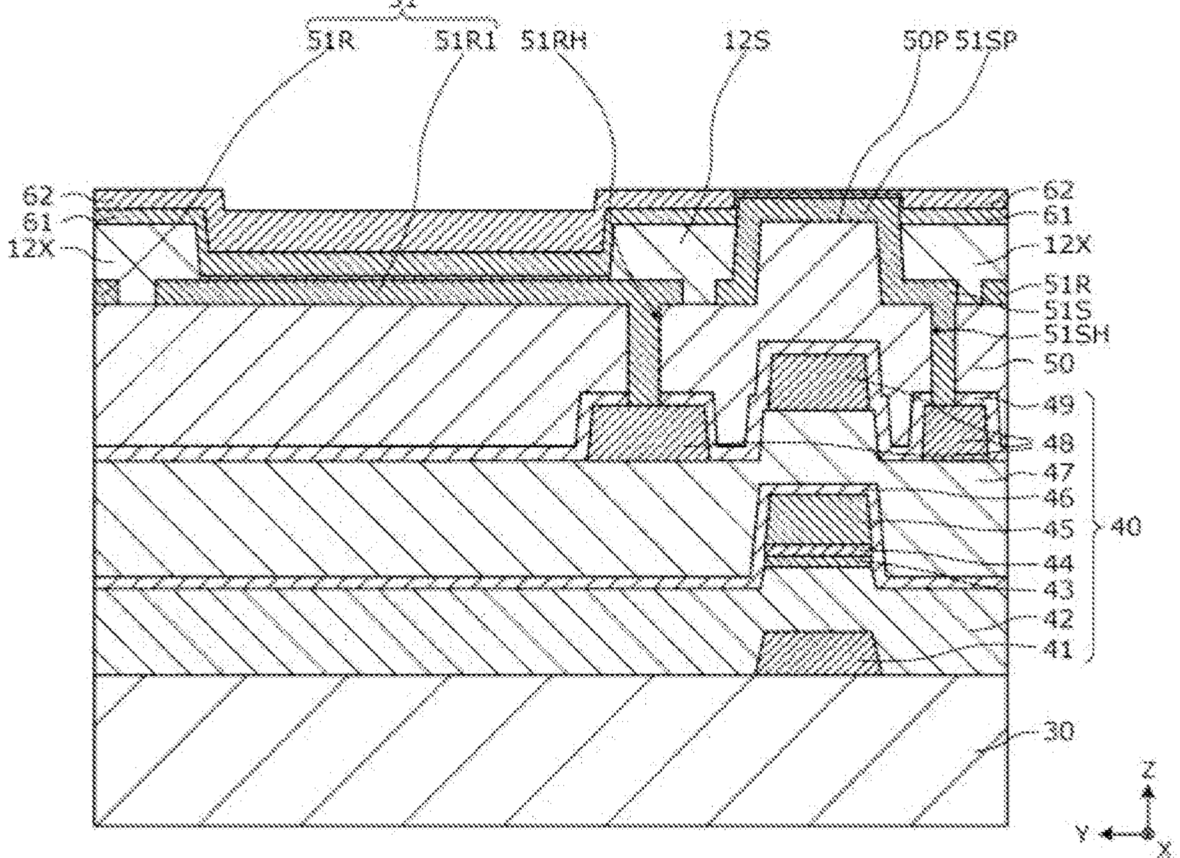
FIG. 17 is a first schematic cross-sectional view of a ninth process of the manufacturing method of the display panel in Embodiment 1.
Figure 18:
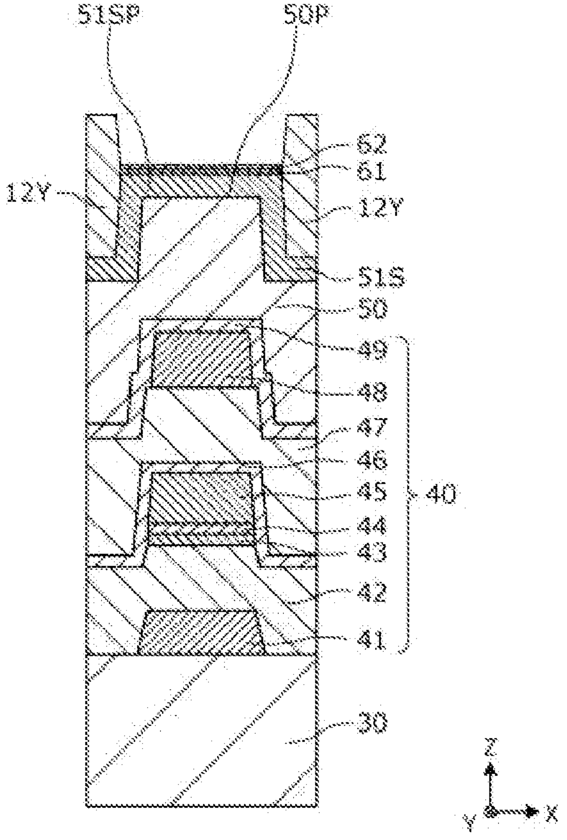
FIG. 18 is a second schematic cross-sectional view of the ninth process of the manufacturing method of the display panel in Embodiment 1.

Next, the material of the light-emitting layer 62 is dried. Thus, as illustrated in FIG. 17 and FIG. 18, a volume of the light-emitting layer 62 is reduced, and the upper surface of the light-emitting layer 62 is lowered. At this time, the upper surface of the protruding part 51SP of the auxiliary electrode 51S is located above the upper surface of the row dam 12X, above the upper surface of the auxiliary dam 12S, and above the upper surface of the pixel electrode. Thus, the thickness of the portion of the light-emitting layer 62 above the protruding part 51SP of the auxiliary electrode 51S is less than the thickness of the portion of the light-emitting layer 62 above the pixel electrodes. It should be noted that the light-emitting layer 62 may also be formed by repeating the above process of layers forming the portions of the light-emitting layer 62.

Figure 19:
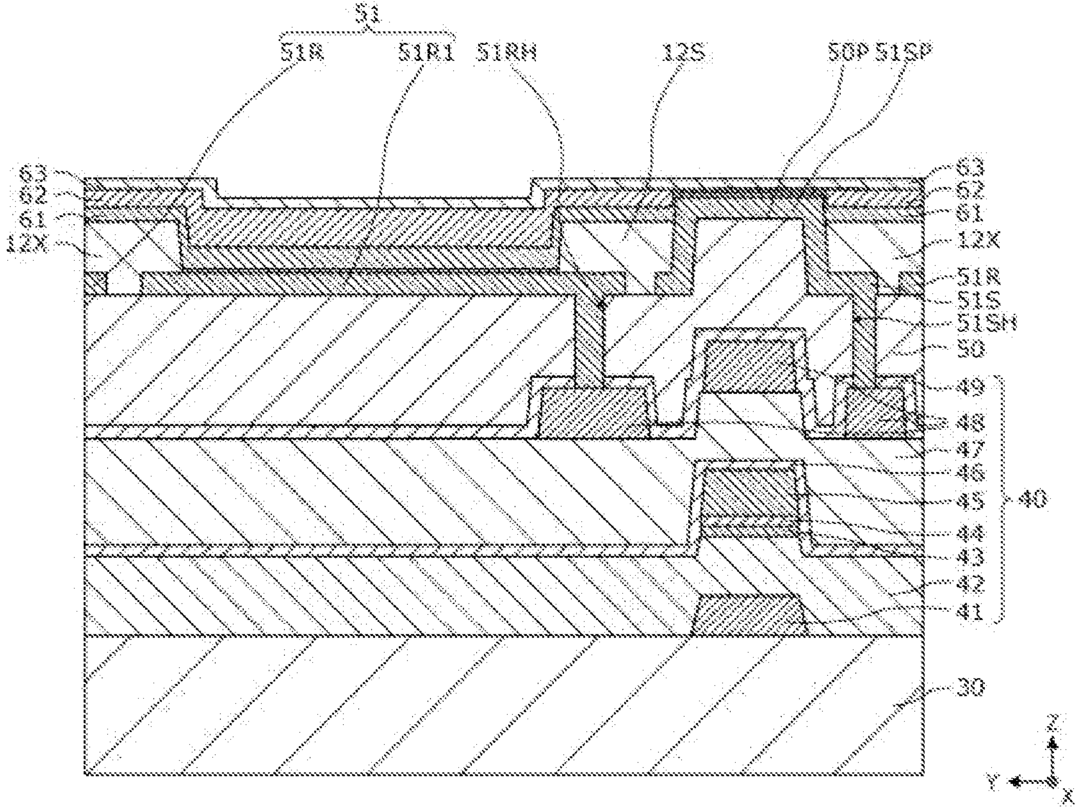
FIG. 19 is a schematic cross-sectional view of a tenth process of the manufacturing method of the display panel in Embodiment 1.

Then, as illustrated in FIG. 19, an electron transport layer 63 is formed above the light-emitting layer 62. In the embodiment, the electron transport layer 63 is formed on an entire surface of a light-emitting area (display area) of the display panel 10 through a vacuum evaporation method. By using the vacuum evaporation method, the damage to the light-emitting layer 62 as an organic film may be reduced. In addition, in the vacuum evaporation method under high vacuum, the molecules of the film-forming object form a film in a vertical direction towards the substrate 30. As a first layer of the electron transport layer 63, a metal oxide or fluoride is formed above the light-emitting layer 62 with a thickness of, for example, more than 1 nm and less than 10 nm by a vacuum evaporation method. Next, a second layer with a thickness of more than 10 nm and less than 50 nm is formed by a co-evaporation plating method of organic materials and metal materials on the first layer. The electron transport layer 63 as a whole has a thickness of more than 20 nm and less than 50 nm. It should be noted that the thickness of the electron transport layer 63 is not limited to the above values.

Figure 20:
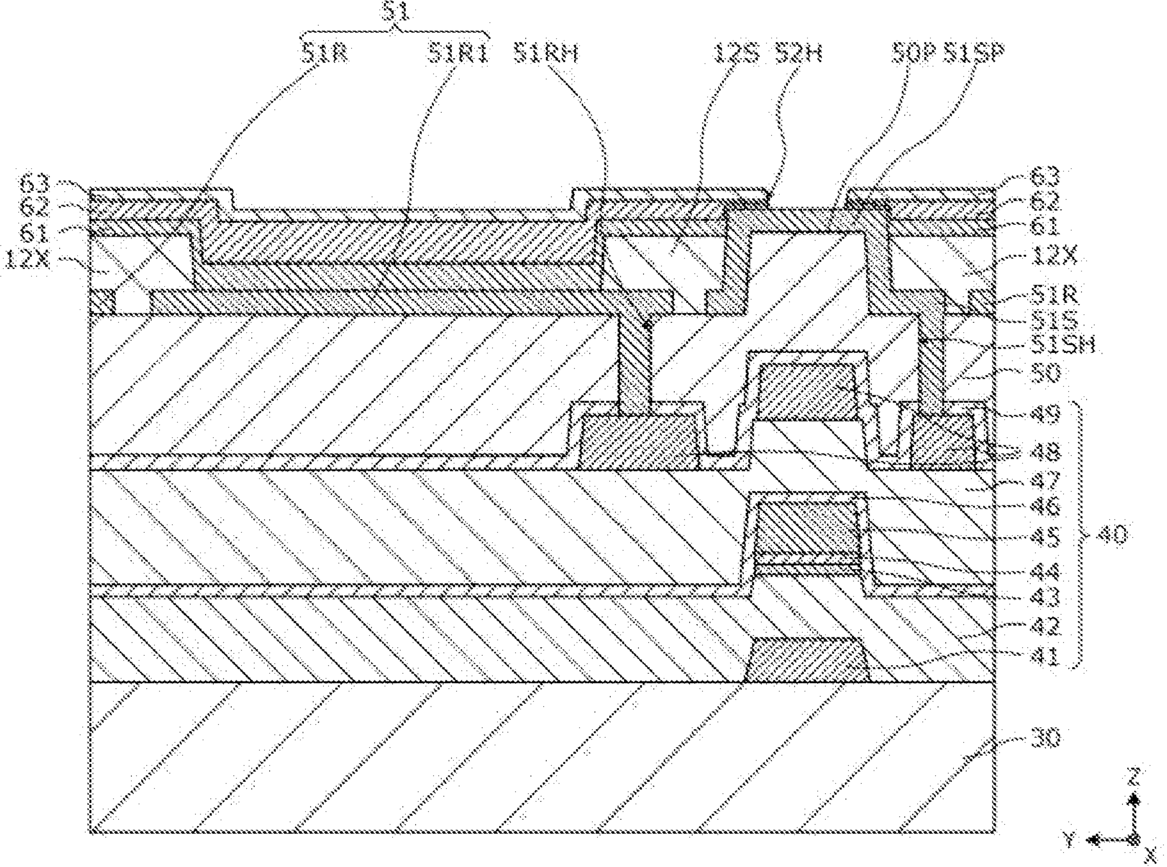
FIG. 20 is a schematic cross-sectional view of an eleventh process of the manufacturing method of the display panel in Embodiment 1.

Then, as illustrated in FIG. 20, through holes 52H are defined in the electron transport layer 63. In the embodiment, the through holes 52H are formed by laser ablation above the protruding parts 51SP of the auxiliary electrodes 51S. Specifically, a portion of the electron transport layer 63 corresponding to an area forming the through holes 52H (i.e., the area above the protruding parts 51SP of the auxiliary electrodes 51S) are formed is removed by irradiating a laser. Thus, the through holes 52H may be formed. In the embodiment, a portion of the light-emitting layer 62 and a portion of the hole transport layer 61 corresponding to the area forming the through holes 52H are also removed. In addition, on a condition that the hole injection layer is formed on the upper surface of the auxiliary electrodes 51S, a portion of the hole injection layer corresponding to the area forming the through holes 52H may also be removed by laser ablation, so as to form the through holes 52H in the hole injection layer. It should be noted that the hole injection layer may also be removed without laser ablation.

For example, Lasers with wavelengths more than 200 nm and less than 380 nm, may be used as lasers in the laser denudation. Specifically, the third highest harmonic (wavelength about 355 nm), the fourth highest harmonic (wavelength about 266 nm) of the YAG laser, or the like may be used.

It should be noted that the auxiliary electrode 51S becomes a base layer for laser ablation. Therefore, a light absorption rate of the auxiliary electrode 51S to the laser may be lower than that of the electron transport layer 63, the light-emitting layer 62, and the hole transport layer 61. As a result, damage to the auxiliary electrode 51S may be suppressed since the amount of laser absorption during laser ablation of the auxiliary electrode 51S is reduced.

Figure 21:
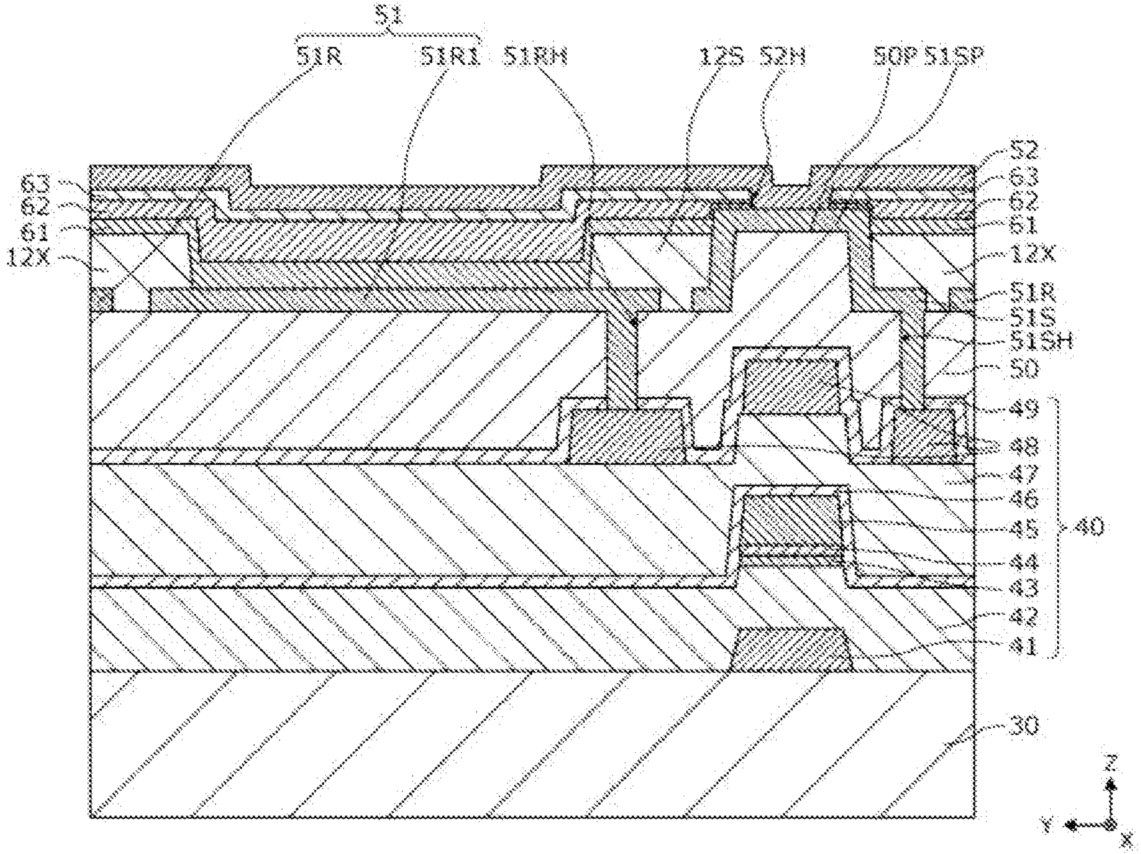
FIG. 21 is a schematic cross-sectional view of a twelfth process of the manufacturing method of the display panel in Embodiment 1.

Then, as illustrated in FIG. 21, a second conductive layer 52 connected to the auxiliary electrodes 51S via the through holes 52H is formed above the electron transport layer 63. In the embodiment, a metal layer such as a silver film is formed by vacuum evaporation as a first layer of the second conductive layer 52. Next, a transparent conductive layer made of a metal oxide such as ITO or IZO is formed on the first layer by sputtering. Thus, the second conductive layer 52 connected to the auxiliary electrodes 51S via the through holes 52H may be formed.

Next, as illustrated in FIG. 4 and FIG. 5, a package layer 17 is formed, and an opposite substrate 18 is arranged. The package layer 17 is formed by chemical vapor deposition or sputtering to cover the second conductive layer 52. The opposite substrate 18 is made of, for example, a light-transmittance bonding material to be bonded with the package layer 17.

The display panel 10 may be manufactured by the processes described above.

[1-3. Effects]

As described above, in the display panel 10 of the embodiment, the insulation film 50 includes the protrusions 50P protruding upward, and the auxiliary electrode 51S includes a protruding part 51SP above the protrusion 50P and located above the pixel electrode. Furthermore, the second conductive layer 52 is connected to the protruding parts 51SP via the through holes 52H.

In this way, the through holes 52H are formed above the protruding parts 51SP. Since the protruding parts 51SP are respectively located above the pixel electrodes, the thickness of the portion of the light-emitting layer 62 disposed above the protruding parts 51SP is less than the thickness of the portion of the light-emitting layer 62 disposed above the electrode pixels. Therefore, when forming the through holes 52H, a thickness of a removed portion of the light-emitting layer 62 may be reduced. Thus, for example, on a condition that the through holes 52H are formed by laser ablation, the intensity of the laser used in laser ablation may be reduced, which may suppress the damage to the auxiliary electrode 51S. In addition, since the amount of the removed portion of the light-emitting layer 62 is reduced, the residue of the light-emitting layer 62 remaining in the through holes 52H may be reduced. Since the amount of flying portions of the light-emitting layer 62 during laser ablation is also reduced, the adverse effect of the flying portions of the light-emitting layer 62 on the display panel 10 may be reduced. In this way, undesirable effects of the formation of the through holes 52H may be suppressed, and therefore the stability of the formation process of the through holes 52H may be improved. In the embodiment, since the through holes 52H may be configured in the subpixels such as the red subpixels 11R, a reduction of the opening rate of the display panel 10 may be suppressed.

Furthermore, in the embodiment, the lower conductive layer 41, the intermediate conductive layer 45, and the upper conductive layer 48 are overlapped to form the protrusions 50P of the insulation film 50. Therefore, it is possible to form the protrusions 50P without adding a new layer or additional manufacturing process.

Furthermore, in the embodiment, the light-emitting layer 62 is a coating film formed by printing, which may simplify the manufacturing process.

Furthermore, in the embodiment, the auxiliary electrode 51S is arranged in the red subpixel 11R. The light-emitting layer 62 in the red subpixel 11R has a longer life than the light-emitting layer 62 in other subpixels. Therefore, by arranging the auxiliary electrode 51S in the red subpixel 11R, even if the area of the light-emitting layer 62 decreases, the current density supplied to the organic electroluminescent element EL of the red subpixel 11R increases, and the deterioration before other subpixels may be suppressed.

Furthermore, in the embodiment, the upper surface of the protruding part 51SP is located above the upper surface of the row dam 12X. Thus, it may be ensured that the thickness of the portion of the light-emitting layer 62 above the protruding part 51SP may be less than the thickness of the portion of the light-emitting layer 62 above the electrode pixels.

Furthermore, in the embodiment, the upper surface of the protruding part 51SP is located below the upper surface of the column dam 12Y. Thus, when coating the material of the light-emitting layer 62, the inflow and outflow of the material of the light-emitting layer 62 between the adjacent red subpixels 11R may be suppressed.

Embodiment 2

The display panel in Embodiment 2 is described below. The display panel in Embodiment 2 differs from the display panel 10 in Embodiment 1 in a structure below the protrusion of the insulation film and the formation of the protrusion. The display panel in the embodiment is centrally described on the differences from the display panel 10 in Embodiment 1

[2-1. Structure of the Display Panel]

Figure 22:
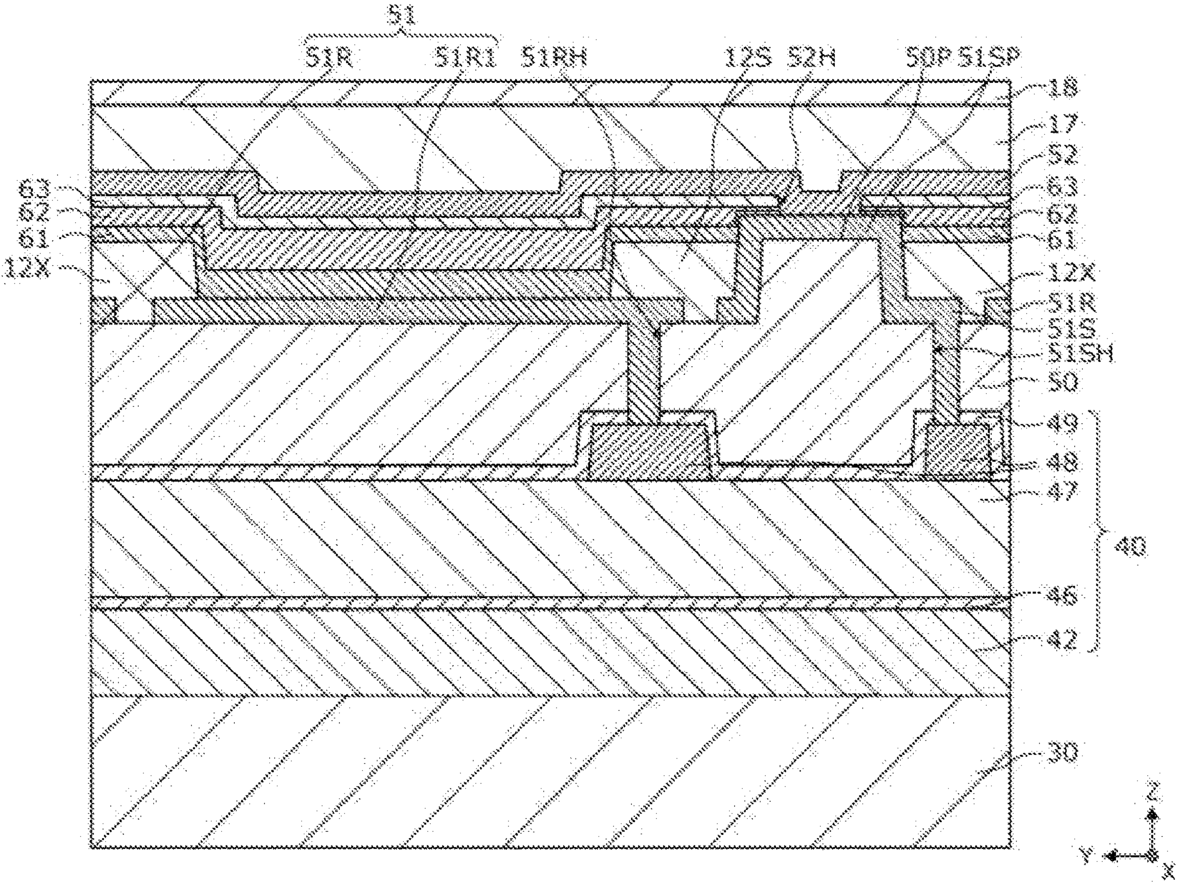
FIG. 22 is a schematic cross-sectional view of a partial structure of a display panel in Embodiment 2 of the present disclosure.

A structure of the display device in the embodiment is illustrated in FIG. 11 which is a schematic cross-sectional view of a partial structure of the display panel. FIG. 22 is a cross-section view of the display panel at a same position as illustrated in FIG. 4.

As illustrated in FIG. 22, the display panel in the embodiment includes the insulation film 50 including protrusions 50P the same as the display panel 10 in Embodiment 1, but a structure of the thin film transistor layer 40 below the insulation film 50 in the embodiment is different from that of the display panel 10 in Embodiment 1. In the display panel, a thickness of a portion of the insulation film 50 corresponding to the protrusion 50P is greater than a thickness of a portion of the insulation film non-corresponding to the protrusion 50P. That is, in the embodiment, the protrusion 50P is formed by increasing a thickness in part of the insulation film 50, rather than overlapping the conductive layers of the thin film transistor layer 40.

The display panel having the above structure may also obtain the same effect as the display panel in Embodiment 1.

[2-2. Manufacturing Method of the Display Panel]

Figure 23:
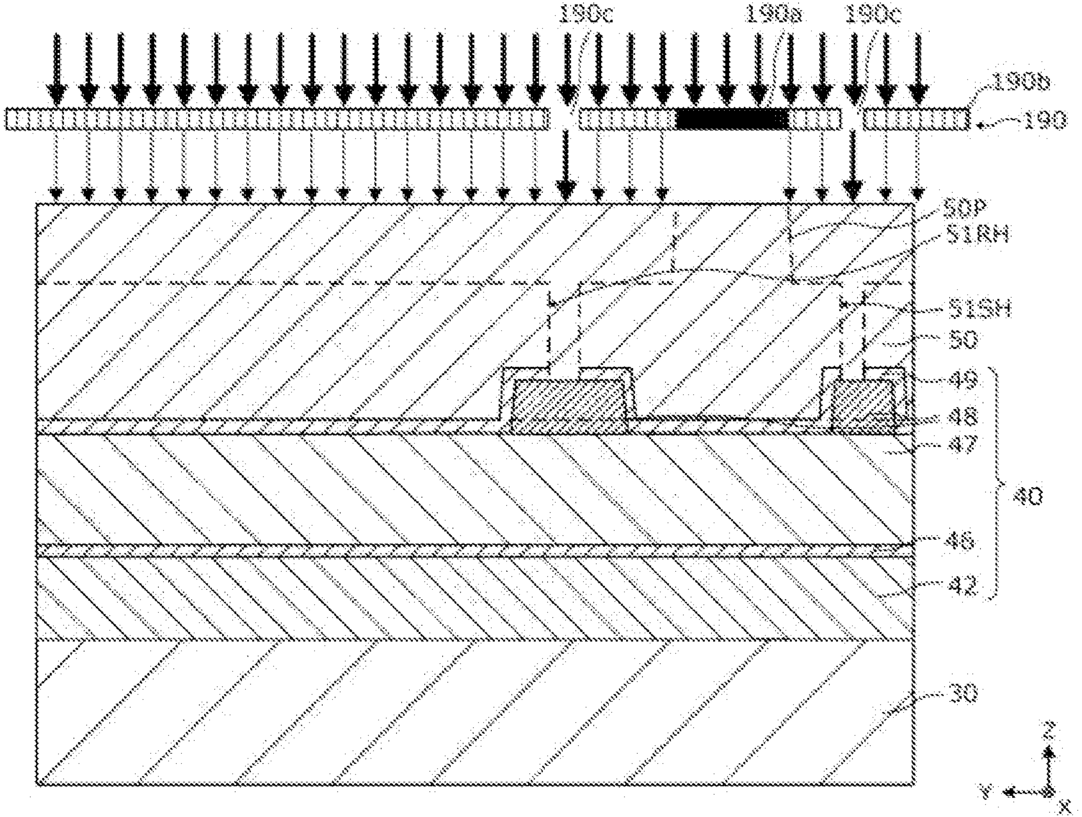
FIG. 23 is a schematic cross-sectional view of a formation process of an insulation film in Embodiment 2 of the present disclosure.

The manufacturing method of the display panel in the embodiment is described below. The manufacturing method of the display panel in the embodiment differs from the manufacturing method of the display panel 10 in Embodiment 1 in the patterning of each layer of the thin film transistor layer 40 below the protrusion 50P of the insulation film and in the formation of the protrusion 50P of the insulation film 50. The formation of the protrusion 50P of the insulation film 50 in the embodiment is illustrated with reference to FIG. 23, which is a schematic cross-sectional view of a formation process of the insulation film 50 in the embodiment. FIG. 23 is a cross-section view of the display panel at a same position as illustrated in FIG. 22.

The structure of the insulation film 50 in Embodiment 2 is same as the insulation film 50 in Embodiment 1. The insulation film 49 is coated with a positive photosensitive organic material such as polyimide resin, phenolic resin, epoxy resin, acrylic resin, or the like.

Next, as illustrated in FIG. 23, the protrusions 50P and the contact holes 51RH and 51SH are formed by halftone exposure. That is, in the embodiment, an exposure mask 190 for patterning the insulation film 50 includes blocking parts 190*a* blocking all lasers (straight arrow in FIG. 23), semi-permeable parts 190*b* allowing some laser to penetrate and blocking other lasers, and permeable parts 190*c* transmitting all lasers. It should be noted that a transmittance of the laser at the blocking part 190*a* may also be not 0%, as long as the transmittance is lower than that of the semi-permeable part 190*b*. A transmittance of the permeable part 190*c* may be not 100%, as long as the transmittance is higher than that of the semi-permeable part 190*b*.

As illustrated in FIG. 23, the blocking part 190*a* is provided corresponding to the protrusion 50P, and the permeable parts 190*c* are provided corresponding to the contact holes 51RH and 51SH. Thus, a portion of the insulation film 50 corresponding to the protrusion 50P is hardly removed by exposure, portions of the insulation film 50 corresponding to the contact holes 51RH and 51SH are removed by exposure, and portions of the insulation film 50 other than the aforementioned portions are partially removed by exposure. Thus, the insulation film 50 having the protrusions 50P and the contact holes 51RH and 51SH as illustrated in FIG. 22 may be formed.

According to the manufacturing method of the display panel in the embodiment, in the exposure process for forming the contact holes 51RH and 51SH in the insulation film 50, the protrusions 50P may be formed only by using halftone exposure. Therefore, no additional manufacturing process is required to form the protrusions 50P.

Other Embodiments

The display panels of the present disclosure as described above are not limited to the above embodiments. For embodiments, within the scope of the subject matter of the present disclosure, the deformation examples obtained by implementing various deformations thought of by those skilled in the art are also included in the present disclosure.

INDUSTRIAL APPLICABILITY

The present invention is particularly suitable for the display panels and display devices with large-scale and high accuracy and having light-emitting elements such as the organic electroluminescent elements, quantum dot light-emitting diodes (QLED), or the like.

What is claimed is:

1. A display panel, comprising:
- a substrate;
- a thin film transistor layer, disposed above the substrate;
- an insulation film, disposed above the thin film transistor layer and comprising protrusions each having a protruding direction away from the thin film transistor layer;
- a first conductive layer, disposed above the insulation film, and comprising pixel electrodes and auxiliary electrodes insulated from the pixel electrodes;
- a light-emitting layer, comprising an organic material and disposed above the first conductive layer;
- a functional layer, disposed above the light-emitting layer and comprising through holes; and
- a second conductive layer disposed above the functional layer,
- wherein the auxiliary electrodes comprise protruding parts correspondingly disposed above the protrusions, a height of each of the protruding parts is higher than a height of each of the pixel electrodes in a vertical direction;
- the through holes correspond to the protruding parts of the auxiliary electrodes, respectively; and
- the second conductive layer is connected to the protruding parts via the through holes.

2. The display panel according to claim 1, wherein the thin film transistor layer further comprises:
- a lower conductive layer;
- an intermediate conductive layer, disposed above the lower conductive layer; and
- an upper conductive layer, disposed above the intermediate conductive layer,
- wherein the lower conductive layer, the intermediate conductive layer, and the upper conductive layer are overlapped below the protrusions.

3. The display panel according to claim 1, wherein a thickness of a portion of the insulation film corresponding to the protrusions is greater than a thickness of a portion of the insulation film non-corresponding to the protrusions.

4. The display panel according to claim 1, wherein the light-emitting layer is a coating film.

5. The display panel according to claim 1, wherein a thickness of a portion of the light-emitting layer correspondingly above the protruding parts is less than a thickness of a portion of the light-emitting layer correspondingly above the pixel electrodes.

6. The display panel according to claim 1, wherein the display panel comprises a plurality of pixels, each of which comprises a red subpixel, a green subpixel, and a blue subpixel, and the auxiliary electrodes are disposed in an area corresponding to the red subpixel.

7. The display panel according to claim 1, further comprising:
- a plurality of pixels, each of which comprising a red subpixel, a green subpixel, and a blue subpixel;

column dams, separating the red subpixel, the green subpixel, and the blue subpixel; and row dams, each separating two adjacent red subpixels, wherein an upper surface of the protruding parts is located above an upper surface of the row dams, and the upper surface of the protruding parts is located below an upper surface of the column dams.

8. A display device, comprising a display panel, and the display panel comprising:

a substrate;

a thin film transistor layer, disposed above the substrate;

an insulation film, disposed above the thin film transistor layer and comprising protrusions each having a protruding direction away from the thin film transistor layer;

a first conductive layer, disposed above the insulation film, and comprising pixel electrodes and auxiliary electrodes insulated from the pixel electrodes;

a light-emitting layer, comprising an organic material and disposed above the first conductive layer;

a functional layer, disposed above the light-emitting layer and comprising through holes; and a second conductive layer disposed above the functional layer, wherein the auxiliary electrodes comprise protruding parts correspondingly disposed above the protrusions, a height of each of the protruding parts is higher than a height of each of the pixel electrodes in a vertical direction;

the through holes correspond to the protruding parts of the auxiliary electrodes, respectively; and the second conductive layer is connected to the protruding parts via the through holes.

9. The display device according to claim 8, wherein the thin film transistor layer further comprises:

a lower conductive layer;

an intermediate conductive layer, disposed above the lower conductive layer; and an upper conductive layer, disposed above the intermediate conductive layer, wherein the lower conductive layer, the intermediate conductive layer, and the upper conductive layer are overlapped below the protrusions.

10. The display device according to claim 8, wherein a thickness of a portion of the insulation film corresponding to the protrusions is greater than a thickness of a portion of the insulation film non-corresponding to the protrusions.

11. The display device according to claim 8, wherein the display panel comprises a plurality of pixels, each of which comprises a red subpixel, a green subpixel, and a blue subpixel, and the auxiliary electrodes are disposed in an area corresponding to the red subpixel.

12. The display device according to claim 8, wherein the display panel comprises:

a plurality of pixels, each of which comprising a red subpixel, a green subpixel, and a blue subpixel;

column dams, separating the red subpixel, the green subpixel, and the blue subpixel; and row dams, each separating two adjacent red subpixels, wherein an upper surface of the protruding parts is located above an upper surface of the row dams, and the upper surface of the protruding parts is located below an upper surface of the column dams.

* * * * *